(12) United States Patent
Epple et al.

(10) Patent No.: US 8,300,211 B2
(45) Date of Patent: Oct. 30, 2012

(54) CATADIOPTRIC PROJECTION OBJECTIVE

(75) Inventors: Alexander Epple, Aalen (DE); Toralf Gruner, Aalen-Hofen (DE); Ralf Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 61 days.

(21) Appl. No.: 12/748,862

(22) Filed: Mar. 29, 2010

(65) Prior Publication Data

US 2011/0075121 A1  Mar. 31, 2011

(30) Foreign Application Priority Data

Sep. 30, 2009 (DE) .................. 10 2009 045 217

(51) Int. Cl.
*G03B 27/54* (2006.01)
*G03B 27/42* (2006.01)

(52) U.S. Cl. .................................. 355/67; 355/53
(58) Field of Classification Search ............... 355/67, 355/53, 77
See application file for complete search history.

(56) References Cited

U.S. PATENT DOCUMENTS

| 6,600,608 | B1 | 7/2003 | Shafer et al. |
| 7,046,339 | B2 | 5/2006 | Stanton et al. |
| 7,551,261 | B2 | 6/2009 | Fiolka |
| 2004/0233405 | A1 | 11/2004 | Kato et al. |
| 2005/0190435 | A1 | 9/2005 | Shafer et al. |
| 2005/0248856 | A1 | 11/2005 | Omura et al. |
| 2006/0072095 | A1 | 4/2006 | Kudo et al. |
| 2006/0121364 | A1 | 6/2006 | Omura |
| 2006/0158633 | A1* | 7/2006 | Mackey et al. .................. 355/67 |
| 2007/0165198 | A1 | 7/2007 | Kneer et al. |
| 2007/0165202 | A1 | 7/2007 | Koehler et al. |
| 2007/0279535 | A1 | 12/2007 | Fiolka |
| 2008/0002167 | A1 | 1/2008 | Gruner et al. |
| 2008/0043214 | A1 | 2/2008 | Mackey et al. |
| 2008/0080067 | A1 | 4/2008 | Omura et al. |
| 2008/0117400 | A1 | 5/2008 | Rostalski et al. |
| 2008/0297884 | A1 | 12/2008 | Mueller |
| 2009/0021712 | A1 | 1/2009 | Kumazawa et al. |
| 2009/0034061 | A1 | 2/2009 | Dodoc et al. |
| 2009/0059358 | A1 | 3/2009 | Epple |

FOREIGN PATENT DOCUMENTS

| JP | 200539211 A | 2/2005 |
| JP | 2005536775 A | 12/2005 |
| JP | 2007505488 A | 3/2007 |
| JP | 2007524248 A | 8/2007 |
| JP | 2007311789 A | 11/2007 |

(Continued)

*Primary Examiner* — Peter B Kim
(74) *Attorney, Agent, or Firm* — Sughrue Mion, PLLC

(57) ABSTRACT

Catadioptric projection objective (1) for microlithography for imaging an object field (3) in an object plane (5) onto an image field (7) in an image plane (9), including a first partial objective (11) imaging the object field onto a first real intermediate image (13), a second partial objective (15) imaging the first intermediate image onto a second real intermediate image (17) and a third partial objective (19) imaging the second intermediate image onto the image field (7). The second partial objective (15) has exactly one concave mirror (21) and at least one lens (23). The minimum distance between an optically utilized region of the concave mirror (21) and an optically utilized region of a surface (25)—facing the concave mirror—of a lens (23) adjacent to the concave mirror is greater than 10 mm.

23 Claims, 10 Drawing Sheets

FOREIGN PATENT DOCUMENTS

| | | |
|---|---|---|
| JP | 2007538277 A | 12/2007 |
| JP | 2008085328 A | 4/2008 |
| TW | 559674 | 11/2003 |
| TW | 200528749 A | 9/2005 |
| WO | WO 2004019128 A2 | 3/2004 |
| WO | WO 2005026843 A2 | 3/2005 |
| WO | WO 2005/111689 A2 | 11/2005 |
| WO | 2008086827 A1 | 7/2008 |
| WO | 2009030444 A2 | 3/2009 |
| WO | 2009080231 A1 | 7/2009 |

\* cited by examiner

CATADIOPTRIC PROJECTION OBJECTIVE

The following disclosure is based on German Patent Application No. DE 102009045217.6, filed on Sep. 30, 2009, which is incorporated into this application by reference.

FIELD OF AND BACKGROUND OF THE INVENTION

The invention relates to a catadioptric projection objective for microlithography for imaging an object field in an object plane onto an image field in an image plane comprising three partial objectives, as well as to a projection exposure apparatus for microlithography comprising an illumination system for providing at least one illumination mode and a catadioptric projection objective for imaging an object field in an object plane onto an image field in an image plane comprising three partial objectives, and also to a method for operating a projection exposure apparatus for microlithography comprising an illumination system for providing at least one illumination mode and a catadioptric projection objective for imaging an object field in an object plane onto an image field in an image plane comprising three partial objectives.

The object field is imaged onto a first real intermediate image by the first partial objective of the catadioptric projection objective, the first intermediate image is imaged onto a second real intermediate image by the second partial objective, and the second intermediate image is finally imaged onto the image field in the image plane by the third partial objective. The second partial objective is a catadioptric objective having exactly one concave mirror and at least one lens. Moreover, the catadioptric projection objective has two folding mirrors, wherein the first folding mirror deflects the projection light coming from the object plane in the direction of the concave mirror of the second partial objective and the second folding mirror deflects the projection light coming from the concave mirror of the second partial objective in the direction of the image plane. The projection objective has exactly two real intermediate images and a numerical aperture of greater than 1.0 in the image plane.

Catadioptric projection objectives of this type are known for example from US 2009/0034061 and from US2005/0248856.

OBJECTS AND SUMMARY OF THE INVENTION

Since the second partial objective has exactly one concave mirror, the projection light passes through the lenses of the second partial objective twice, to be precise the first time on the outgoing path from the first folding mirror to the concave mirror, and the second time after the reflection of the projection light at the concave mirror on the return path from the concave mirror to the second folding mirror. As a result of the doubled passage, the local radiation loading of these lenses can double in comparison with single passage if identical regions of these lenses are irradiated by projection light both on the outgoing path and on the return path thereof.

In this case, the radiation loading is all the higher, the higher the radiated-in light power of the light source and the smaller the extent of the projection light beam. The increase in the power of the light source and the reduction of the extent of the projection light beam in regions of the projection objective that are near the pupil are current requirements made of a projection exposure apparatus. This means that the increase in the light power of the light source is accompanied by an increase in the throughput of a microlithography projection exposure apparatus. In order to increase the resolution, the entrance pupil of the projection objective is illuminated only in small pupil regions in comparison with the extent of the entrance pupil, the so-called illumination poles. In this case, the intensity distribution of the illumination light in the entrance pupil characterizes an illumination mode. An illumination pole represents a continuous region within the intensity distribution of the entrance pupil, in which the intensity does not fall below 10% of a maximum intensity. Moreover, these illumination poles usually lie at the edge of the entrance pupil. In this case, the entrance pupil is a virtual or real opening that delimits the beams incident in the projection objective. It is constructed by the aperture stop of the projection objective being imaged by the refractive or reflective surfaces of lenses or mirrors which are situated upstream of the aperture stop in the light direction. The entrance pupil thus represents the object-side image of the aperture stop of the projection objective. If a structure-bearing mask at which the illumination light is diffracted is arranged within the object field of the projection objective, projection light distributions characterized by the zeroth diffraction order and higher diffraction orders, in the case of structure widths near the resolution limit of the projection objective exclusive of the first diffraction order, arise in the subsequent pupil planes. In this case, the projection light distribution for the zeroth diffraction order corresponds to the illumination distribution in the entrance pupil. The illumination poles such as are provided in the entrance pupil of the projection objective are therefore also manifested in the subsequent pupil planes of the projection objective. A pupil plane conjugate to the entrance pupil is situated on the concave mirror or at least in the vicinity of the concave mirror of the second partial objective. The illumination with illumination poles such as is produced by the illumination system in the entrance pupil of the projection objective is therefore also present on the concave mirror and on the lenses of the second partial objective which are arranged in the vicinity of the concave mirror. Consequently, the increase in the resolution leads to an increase in the local radiation loading of the lenses arranged in the vicinity of the concave mirror.

By reducing the wavelength of the projection light, the resolution is likewise increased. Therefore, laser light sources having wavelengths in the deep UV wavelength range, that is to say for example at 248 nm, at 193 nm or at 157 nm, are used in projection exposure apparatuses. In this wavelength range, typical lens materials such as quartz or calcium fluoride, for example, exhibit damage on account of the irradiation. Thus, in the case of quartz, material compaction, material rarefaction, stresses induced thereby and stress birefringence caused thereby in turn can occur. The effect of a polarization-induced birefringence is likewise known, in the case of which the material alteration is dependent on the polarization state of the projection light. Moreover, the irradiation can lead to a transmission loss owing to the formation of color centers. The effects mentioned depend in part non-linearly on the irradiance, such that a doubling of the radiation loading can lead to significantly greater damage, as would be the case for effects linearly dependent on the irradiance.

The doubled passage through the lenses adjacent to the concave mirror, the increase in the light power of the light source for increasing the throughput, the illumination of the entrance pupil and thus of the lenses adjacent to the concave mirror with illumination poles having a small extent, the use of deep UV light and the use of lens materials which can be damaged on account of the radiation loading have the effect that, in the case of this class of projection objectives, the lenses of the second partial objective which are arranged adjacent to the concave mirror are particularly at risk of being damaged by the operation of the projection exposure apparatus.

It is an object of the invention, then, to specify a catadioptric projection objective, a projection exposure apparatus comprising an illumination system and a catadioptric projection objective, and also a method for operating a projection exposure apparatus comprising an illumination system and a catadioptric projection objective, which, despite these boundary conditions, enable the lithographic production of semiconductor components with uniform quality.

This object is achieved, according to one formulation, by a catadioptric projection objective for microlithography configured to image an object field in an object plane onto an image field in an image plane, comprising
- a first partial objective configured to image the object field onto a first real intermediate image,
- a second partial objective configured to image the first intermediate image onto a second real intermediate image, and
- a third partial objective configured to image the second intermediate image onto the image field, wherein the second partial objective has exactly one concave mirror and at least one lens,
wherein the projection objective has a first folding mirror configured to deflect the radiation coming from the object plane toward the concave mirror and a second folding mirror configured to deflect the radiation coming from the concave mirror toward the image plane,
wherein the projection objective forms exactly two real intermediate images, wherein the projection objective has a numerical aperture of greater than 1.0 in the image plane, and wherein the minimum distance between the optically utilized region of the concave mirror and the optically utilized region of a surface—facing the concave mirror—of a lens adjacent to the concave mirror is greater than 10 mm.

The optically utilized region of a mirror surface or lens surface is understood to mean that region in which lie the intersection points of all light rays which are possible on the basis of the extent of the object field and in the case of a maximally open aperture stop. By contrast, the physical extent of a lens or of a mirror is generally larger than the optically utilized region on account of manufacturing tolerances and the necessity of a mechanical mounting of the lens or of the mirror. The distance is determined between a point on the mirror surface of the concave mirror within the optically utilized region of the concave mirror and a point on the surface—facing the concave mirror—of the lens adjacent to the concave mirror within the optically utilized region of said surface. In this case, the minimum distance results as the minimum of all possible distance values.

Whereas in the case of a small distance between the mirror surface of the concave mirror and the adjacent lens surface, the rays of an extended light beam pass through the lens surface on the outgoing path and on the return path in regions which generally overlap, this can be avoided if the distance between the mirror surface of the concave mirror and the adjacent lens surface is increased. The lens arranged adjacent to the concave mirror is then admittedly still passed through twice, but now on spatially separated paths. As a result, the radiation loading is not doubled in any region.

The spatial separation of a light beam on the outgoing path to the concave mirror and on the return path from the concave mirror is caused by the fact that this class of projection objectives has an object field arranged off-axis. That is to say that the point of intersection of the optical axis with the object plane lies outside the object field. Therefore, the first intermediate image and the second intermediate image are also arranged off-axis, to be precise on opposite sides of the optical axis. The first intermediate image and the second intermediate image are consequently spatially separated from one another. By contrast, the illumination in a pupil plane and thus on that concave mirror of the second partial objective which is arranged in the vicinity of the pupil plane is field-independent, that is to say independent of the form and position of the object field. Whereas radiation beams on the outgoing path and on the return path consequently run in spatially separated fashion in the region of the intermediate image planes arranged off-axis, an overlap of the radiation beams on the outgoing path and on the return path and hence a doubling of the radiation loading occur in the region of the concave mirror.

The fact of whether rays which emerge from an illumination pole in the entrance pupil of the projection objective pass through the lens surface facing the concave mirror on the outgoing path and on the return path in spatially separated regions is dependent on the extent of the illumination pole in the entrance pupil in the so-called y-direction. In this case, the y-direction runs parallel to a straight line that is perpendicular to the respective optical axis of the projection objective and lies within a plane of symmetry of the projection objective. The plane of symmetry is spanned by the three optical axes of the three partial objectives. In this case, the optical axis of a partial objective represents a continuous straight line with respect to which the optical surfaces of the optical elements of the partial objective have a rotationally symmetrical mathematical surface description even though the boundaries of the optical elements need not necessarily be embodied rotationally symmetrically with respect to this optical axis. The transition from the first optical axis to the second optical axis takes place through the first folding mirror. The transition from the second optical axis to the third optical axis takes place through the second folding mirror. The y-direction thus changes its direction at each folding mirror in accordance with the change in direction of the optical axis. In accordance with this folding geometry, although the object field is arranged symmetrically with respect to the plane of symmetry, it is arranged in decentred fashion with respect to the optical axis of the first partial objective in the y-direction. Therefore, the first intermediate image and the second intermediate image are also arranged in decentred fashion with respect to the optical axis in the y-direction. Consequently, the separation of the radiation beams on the lens surface adjacent to the concave mirror on the outgoing path and on the return path also arises only when the radiation beams do not exceed an extent in the y-direction dependent on the distance between the lens surface and the concave mirror. Said extent is in turn directly dependent on the extent of the illumination pole in the y-direction in the entrance pupil.

If the minimum distance between the optically utilized region of the concave mirror and the optically utilized region of a surface—facing the concave mirror—of a lens adjacent to the concave mirror is greater than 10 mm, then for example a projection light beam with an extent of the illumination pole in the y-direction of 1% of the pupil radius of the entrance pupil runs on the outgoing and return paths in spatially separated regions.

In one embodiment of the invention, the distance is greater than 20 mm. In that case, for example a projection light beam with an extent of the illumination pole in the y-direction in the entrance pupil of the projection objective of 2% of the pupil radius of the entrance pupil runs on the outgoing and return paths in spatially separated regions.

In one embodiment of the invention, the distance is greater than 30 mm. In that case, for example a projection light beam with an extent of the illumination pole in the y-direction in the entrance pupil of the projection objective of 4% of the pupil radius of the entrance pupil runs on the outgoing and return paths in spatially separated regions.

In one embodiment of the invention, the distance is greater than 40 mm. In that case, for example a projection light beam with an extent of the illumination pole in the y-direction in the entrance pupil of the projection objective of 5% of the pupil radius of the entrance pupil runs on the outgoing and return paths in spatially separated regions.

In general, in the case of this class of projection objectives, the concave mirror has greater bending in comparison with the adjacent lens surface for the purpose of better correction of the image field curvature. This has the effect that the distance between the concave mirror and the adjacent lens surface is the smallest at the edge of the concave mirror. The spatial separation of a light beam on the outgoing path and on the return path is therefore particularly difficult on the adjacent lens surface when the light beam is aimed at the edge of the concave mirror, that is to say originates from an illumination pole at the edge of the entrance pupil. In order then to reduce the radiation loading on the lens surface—facing the concave mirror—of the lens adjacent to the concave mirror, the distance between the concave mirror and the lens adjacent to the concave mirror is chosen to be so large that all rays which emerge from an illumination pole in the entrance pupil and intersect the object plane at a central object point within the object field pass through that surface of the lens which faces the concave mirror on the light path towards the concave mirror and on the light path away from the concave mirror in spatially separated regions, wherein the illumination pole is arranged at the edge of the entrance pupil, and wherein the extent of the illumination pole in the y-direction is greater than 2% of the pupil radius of the entrance pupil. An illumination pole is arranged at the edge of the entrance pupil when the illumination pole at a maximum distance of 5% of the pupil radius at the entrance pupil from the edge of the entrance pupil has an intensity of at least 10% relative to the maximum intensity of the illumination pole. The extent of an illumination pole in the y-direction is determined by taking a section through the intensity profile of the illumination pole along the y-direction and determining the distance between the two 10% points, at which the intensity profile, proceeding from a maximum value, has fallen to a value of 10% relative to the maximum value. In this case, the extent of the illumination pole in the y-direction represents the maximum possible value for the distance between the 10% points for this illumination pole. The central object point is understood to mean an object point which lies on the straight line of intersection between the object plane and the plane of symmetry and is at the same distance from the upper and lower object field edges in the y-direction.

In one embodiment of the invention, given otherwise identical boundary conditions, the extent of the illumination pole in the y-direction is greater than 5% of the pupil radius of the entrance pupil, wherein all the rays still pass through that surface of the lens which faces the concave mirror on the outgoing path and on the return path in spatially separated regions.

In one embodiment of the invention, given otherwise identical boundary conditions, the extent of the illumination pole in the y-direction is greater than 8% of the pupil radius of the entrance pupil, wherein all the rays still pass through that surface of the lens which faces the concave mirror on the outgoing path and on the return path in spatially separated regions.

The concave mirror of the second partial objective makes a significant contribution to the correction of the image field curvature. In this case, said contribution is all the greater, the greater the curvature of the concave mirror. The curvature of the concave mirror can be increased further if a lens having a negative optical refractive power, a so-called negative lens, is arranged upstream of the concave mirror in the light direction, said lens exerting a diverging effect on the light beam. In order to keep the diameter of the concave mirror as small as possible, the negative lens is generally only at a small distance from the concave mirror. This is necessary particularly when the numerical aperture in the image plane is greater than 1.0, to be precise because on the one hand the diameter of the concave mirror increases with the numerical aperture of the projection objective on account of its arrangement in the vicinity of a pupil plane, and on the other hand the curvature of the concave mirror is only given by the correction of the image field curvature. Consequently, at the same time as the diameter increases, the aperture of the concave mirror, that is to say the ratio of half mirror diameter to vertex radius, increases and can lead to mirror geometries in the vicinity of hemispheres for a numerical aperture of greater than 1.0. In order to guarantee a finite edge distance between negative lens and concave mirror, it is necessary to increase the distance of the surface vertex between negative lens and concave mirror. In the extreme case of a concave mirror in the form of a hemisphere, the negative lens would be located in the vicinity of the center of curvature. Since the concave mirror essentially produces a 1:1 imaging, the negative lens would consequently be arranged in the vicinity of the two intermediate images. In this case, the distance between the concave mirror and the negative lens cannot be increased further. In the case of a numerical aperture of less than 1.0, by contrast, the situation eases significantly. For the same correction of the image field curvature, the mirror has a significantly smaller aperture, whereby a larger edge distance between concave mirror and negative lens can be achieved more simply. If, in the case of a numerical aperture of greater than 1.0, the distance between the concave mirror and the adjacent negative lens is increased without the contribution of the concave mirror to the correction of the image field curvature simultaneously being reduced, then the mirror diameter increases, the concave mirror assumes the form of a hemisphere and the negative lens is located in the vicinity of the intermediate images. A concave mirror having a large diameter and the form of a hemisphere is unfavourable from a production engineering standpoint. Consequently, for a numerical aperture in the image plane of greater than 1.0, a small distance between concave mirror and adjacent lens is favourable for the correction of the image field curvature and for production engineering reasons. Conflicting with this is the requirement to increase the distance between concave mirror and adjacent lens in order to reduce the radiation loading by separating the projection light beam. The distance between concave mirror and adjacent lens is therefore increased only to an extent such as is necessary for reducing the radiation loading of the lens adjacent to the concave mirror, on the one hand, and still ensures the correction of the image field curvature, if appropriate with additional contributions to the correction of the image field curvature from other optical elements of the projection objective, on the other hand.

The projection objective has three partial objectives with exactly two real intermediate images. There are no further intermediate images within the three partial objectives. In one embodiment of the invention, only the second partial objective is embodied as a catadioptric partial objective with exactly one concave mirror, while the first partial objective and the third partial objective are embodied in purely refractive fashion, that is to say have no imaging mirrors. Consequently, the concave mirror of the second partial objective makes the essential contribution to the correction of the image field curvature.

In one embodiment of the invention, the distance between the surface vertex of the concave mirror and the surface vertex of the lens adjacent to the concave mirror is less than the vertex radius of the concave mirror. In this case, the vertex radius of the concave mirror specifies the radius at the surface vertex of the concave mirror. A further real intermediate image would otherwise form between the concave mirror and the lens adjacent to the concave mirror. In this case, the surface vertex represents the point of intersection of a surface with the optical axis. Consequently, the distance between the surface vertices is measured along the optical axis.

In one embodiment of the invention, the distance between the surface vertex of the concave mirror and the surface vertex of the lens adjacent to the concave mirror is less than 70% of the vertex radius of the concave mirror.

In one embodiment of the invention, the two folding mirrors are embodied as separate mirrors.

In another embodiment of the invention, the two folding mirrors are realized as reflectively coated side surfaces of a monolithic body, for example of a prism with a triangle as base surface.

In one embodiment of the invention, the concave mirror of the second partial objective has a vertex radius of less than 200 mm. A concave mirror contributes to the Petzval sum with a negative contribution of 2/r, where r is the vertex radius of the concave mirror. The Petzval sum is a measure of the image field curvature. With corrected image field curvature, the Petzval sum vanishes. Since lenses having a positive refractive power increase the Petzval sum and concave mirrors decrease the Petzval sum, a concave mirror having a vertex radius of less than 200 mm is favourable for the correction of the image field curvature on account of its large negative contribution, to be precise particularly when the projection objective has a numerical aperture in the image plane of greater than 1.0, since lenses having a large positive refractive power are then used.

In one embodiment of the invention, the concave mirror of the second partial objective has a diameter of the optically utilized region of less than 260 mm. What is thereby achieved is that the concave mirror can be produced and qualified with reasonable outlay.

In one embodiment of the invention, the lens adjacent to the concave mirror is composed of quartz. Quartz exhibits the damage already mentioned in the case of high radiation loading. Said damage can be avoided if care is taken to ensure that, in the case of a lens composed of quartz, the distance between the concave mirror and said lens is increased to an extent such that, in the case of illumination poles having a small extent in the y-direction, the regions irradiated on the outgoing and return paths are spatially separated from one another.

In one embodiment of the invention, all the lenses of the projection objective are composed of quartz.

In one embodiment of the invention, all the lenses of the projection objective are composed of quartz apart from the lens arranged upstream of the image plane in the light direction. In one embodiment of the invention, the lens arranged upstream of the image plane in the light direction is composed of a material having a higher refractive index than quartz, in particular higher than 1.8. In one embodiment of the invention, the lens arranged upstream of the image plane in the light direction is composed of spinel. Through the use of materials having a high refractive index, the numerical aperture in the image plane can be increased to values of greater than 1.4.

The reduction of the radiation loading of the lenses of the second partial objective which are passed through twice makes it possible to provide a projection exposure apparatus which permits the entrance pupil of the projection objective to be illuminated with at least one illumination pole whose maximum extent in the y-direction is less than 8% of the pupil radius of the entrance pupil of the projection objective. In this case, the projection exposure apparatus for microlithography comprises an illumination system, which provides at least one illumination mode, and a catadioptric projection objective, which images an object field in an object plane onto an image field in an image plane, comprising a first partial objective configured to image the object field onto a first real intermediate image, a second partial objective configured to image the first intermediate image onto a second real intermediate image, and a third partial objective configured to image the second intermediate image onto the image field, wherein the second partial objective has exactly one concave mirror and at least one lens, wherein the projection objective has a first folding mirror configured to deflect the radiation coming from the object plane toward the concave mirror and a second folding mirror configured to deflect the radiation coming from the concave mirror toward the image plane, wherein the projection objective forms exactly two real intermediate images, and wherein the projection objective has a numerical aperture of greater than 1.0 in the image plane.

In this case, the illumination system is configured such that, in one of the possible illumination modes, it illuminates the entrance pupil of the projection objective with at least one illumination pole whose maximum pole extent in the y-direction is less than 8% of the pupil radius of the entrance pupil.

In order to provide the at least one illumination mode, the illumination system has, for example, suitable diffractive optical elements or a two-dimensional arrangement of tiltable mirrors. The latter manipulate the illumination light in such a way that the desired illumination mode is provided in the exit pupil of the illumination system, or in the entrance pupil of the projection objective succeeding the illumination system. Said illumination mode has, for example, at least one illumination pole having a maximum extent in the y-direction of less than 8% of the pupil radius of the entrance pupil.

In one embodiment of the invention, the illumination system is configured such that the at least one illumination pole illuminates the center of the entrance pupil. In this case, the center of the entrance pupil is given by the point of intersection of the optical axis of the first partial objective with the entrance pupil plane. The illumination mode in the case of which the entrance pupil is only illuminated in the center with a single illumination pole having a small extent produces a so-called coherent illumination, which is used particularly when phase-shifting masks are used.

In another embodiment of the invention, the illumination system is configured in such a way that all the illumination poles are arranged at the edge of the entrance pupil. Illumination modes in the case of which the illumination poles are arranged outside the center of the entrance pupil are referred to as dipole, quadrupole or multipole illumination, depending on the number of illumination poles. If the image with a structure arranged within the object field arises as a result of interference of the zeroth diffraction order with the first diffraction order, then the resolution limit is reached when the zeroth and first diffraction orders are situated on opposite sides of the objective pupil at the edge of the objective pupil. This presupposes that the entrance pupil of the projection objective is illuminated with at least one illumination pole which is arranged at the edge of the entrance pupil.

In one embodiment of the invention, the entrance pupil is illuminated with pairwise illumination poles lying opposite with respect to the center of the entrance pupil. Since the zeroth and first diffraction orders within the projection objective have different intensities, symmetrical exposure conditions in the image plane of the projection objective arise as a result of the illumination of the structures with pairwise illumination poles lying opposite with respect to the center of the entrance pupil as effective light source.

The fact of whether the lenses of the second partial objective which are passed through twice are damaged on account of the radiation loading is dependent on the maximum surface power density which impinges on the lens surfaces. From the lenses of the second partial objective which are passed through twice, the surface—facing the concave mirror—of the lens adjacent to the concave mirror has the highest loading since this surface is arranged the closest to a pupil plane. In this case, the maximum surface power density that occurs is dependent on the illumination mode provided by the illumination system of the projection exposure apparatus. If a specific illumination mode is set by merely redistributing the light in the entrance pupil of the projection objective, then the total power with which a lens surface in the subsequent projection objective is illuminated remains virtually independent of the illumination mode. By contrast, the surface power density increases in the individual illumination pole as the extent of the illumination pole becomes smaller. Therefore, the illumination system is configured in such a way that for all the illumination modes, on the surface—facing the concave mirror—of the lens adjacent to the concave mirror, the maximum surface power density is less than 0.6 W/cm$^2$, while the total power of the illumination light in the object plane is greater than 1.5 W. This is achieved for example by virtue of the fact that the maximum surface power density on this lens surface is known on account of the predefined illumination mode and the illumination mode can be set only when the maximum surface power density is less than a predefined threshold value. In this case, the surface power density can be determined beforehand for example with suitable simulation calculations on the basis of the illumination of the entrance pupil. The results of the simulation calculations can be stored for example in a central computer of the projection exposure apparatus in a form which permits the control program of the projection exposure apparatus to determine for a desired illumination mode whether or not the latter is permitted to be set.

According to another formulation, a method is provided for operating a projection exposure apparatus for microlithography comprising providing at least one illumination mode with an illumination system, and imaging an object field in an object plane onto an image field in an image plane with a catadioptric projection objective, comprising
 a first partial objective imaging the object field onto a first real intermediate image,
 a second partial objective imaging the first intermediate image onto a second real intermediate image, and
 a third partial objective imaging the second intermediate image onto the image field,
wherein the second partial objective has exactly one concave mirror and at least one lens,
wherein the projection objective further comprises a first folding mirror deflecting the radiation coming from the object plane toward the concave mirror and a second folding mirror deflecting the radiation coming from the concave mirror toward the image plane,
wherein the projection objective forms exactly two real intermediate images, and
wherein the projection objective has a numerical aperture of greater than 1.0 in the image plane.

In the method, the illumination system, depending on the illumination mode, illuminates the entrance pupil of the projection objective with a differing number of illumination poles and with illumination poles of differing form. In this case, in one illumination mode, the maximum extent of the illumination pole in the y-direction is less than or equal to 8% of the pupil radius of the entrance pupil.

According to a further formulation, also provided is a method for operating a projection exposure apparatus for microlithography comprising an illumination system providing at least one illumination mode and a catadioptric projection objective imaging an object field in an object plane onto an image field in an image plane, comprising
 a first partial objective imaging the object field onto a first real intermediate image,
 a second partial objective imaging the first intermediate image onto a second real intermediate image, and
 a third partial objective imaging the second intermediate image onto the image field,
wherein the second partial objective has exactly one concave mirror and at least one lens,
wherein the projection objective has a first folding mirror deflecting the radiation coming from the object plane in the direction of the concave mirror and a second folding mirror deflecting the radiation coming from the concave mirror in the direction of the image plane,
wherein the projection objective forms exactly two real intermediate images, and
wherein the projection objective has a numerical aperture of greater than 1.0 in the image plane.

In the method, the illumination system provides an illumination mode, only when, on the surface—facing the concave mirror—of the lens adjacent to the concave mirror, the maximum surface power density is less than 0.6 W/cm$^2$, while the total power of the illumination light in the object plane is greater than 1.5 W.

BRIEF DESCRIPTION OF THE DRAWINGS

Details of the invention are explained more thoroughly below on the basis of the exemplary embodiments illustrated in the figures, in which specifically.

DETAILED DESCRIPTION OF THE PREFERRED EMBODIMENTS

Figure 1:
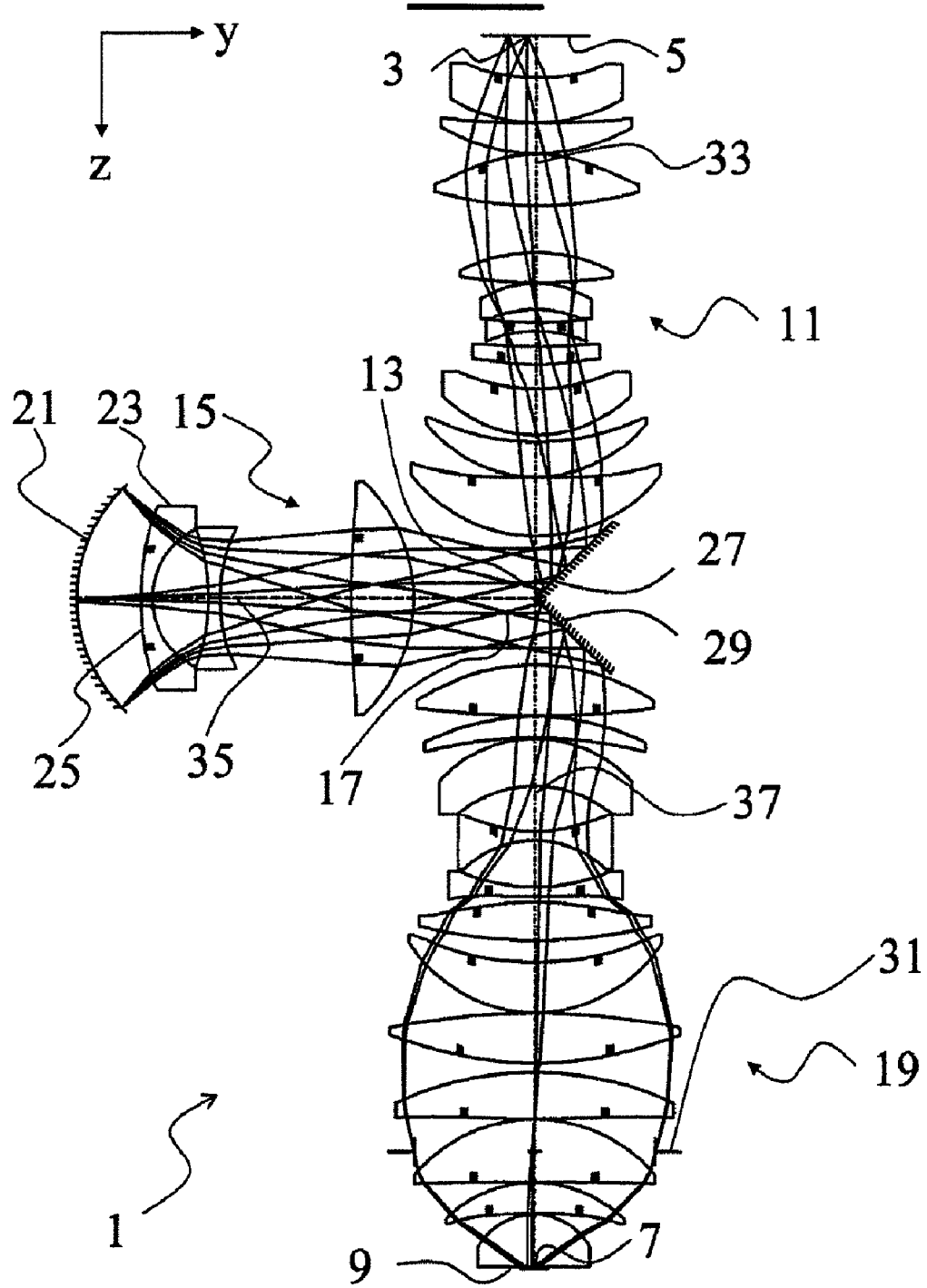
FIG. 1 shows a lens section of a catadioptric projection objective.

FIG. 1 shows a lens section of a catadioptric projection objective 1. The optical data for the projection objective 1 are compiled in Table 1. The lens materials used are, in all the lenses apart from the lens adjacent to the image plane, quartz ($SiO_2$), having a refractive index of n=1.5603261 at a wavelength of 193.306 nm and, in the lens adjacent to the image plane, spinel ($MgAl_2O_4$) having a refractive index of n=1.91 at a wavelength of 193.306 nm. The aspherical surfaces can be described by the following sagitta formula:

$$p(h) = \frac{\frac{1}{R}h^2}{1+\sqrt{1-(1+K)\left(\frac{1}{R}\right)^2 h^2}} + \sum_{k=1} C_k h^{2k+2}$$

In this case, p represents the axial distance in [mm] of the aspherical surface from a plane—perpendicular to the optical axis—through the vertex of the aspherical surface in the case of the radial distance h in [mm], R represents the vertex radius in [mm], K represents the conical constant and $C_k$ represents the individual aspherical constants of the order k in

TABLE 2

| Aperture ray | $x_f$[mm] | $y_f$[mm] | $x_p$ | $y_p$ |
|---|---|---|---|---|
| 39 | 0 | −20.89 | 0 | +0.048 |
| 41 | 0 | −20.89 | 0 | −0.048 |

The projection objective 1 images the object field 3 in the object plane 5 onto the image field 7 in the image plane 9. It comprises a first partial objective 11, which images the object field 3 onto the first real intermediate image 13, the second partial objective 15, which images the first intermediate image 13 onto the second real intermediate image 17, and the third partial objective 19, which images the second intermediate image 17 onto the image field 7. The second partial objective 15 is embodied as a catadioptric objective having the concave mirror 21 and three lenses. In this case, the lens 23 is arranged adjacent to the concave mirror. The lens surface 25 of the lens 23 faces the concave mirror 21. The folding mirror 27 is arranged in the region of the first intermediate image 13, said folding mirror deflecting the projection light coming from the object plane 5 in the direction of the concave mirror 21. The folding mirror 29 is arranged in the region of the second intermediate image 17, said folding mirror deflecting the projection light coming from the concave mirror 21 in the direction of the image plane 9.

The first partial objective 11 has a first optical axis 33, the second partial objective 15 has a second optical axis 35, and the third partial objective 19 has a third optical axis 37. The optical axes 33, 35 and 37 span a plane of symmetry that coincides with the plane of the drawing. In each partial objective 11, 15 and 19, a y-direction is defined by the fact that it runs parallel to a straight line that lies within the plane of symmetry and is perpendicular to the respective optical axes 33, 35 and 37.

In each case the principal ray and the two marginal rays are depicted for two object points at y=−10 mm and y=−32 mm within the object field 3. The principal rays intersect the optical axis 37 in the region of the aperture stop 31 and run telecentrically, that is to say parallel to the optical axis 37, in the image plane 9. The marginal rays run in the plane of symmetry and are defined by the edge of the aperture stop 31.

The first partial objective 11 is formed by the surfaces with the surface numbers 1 to 20, the second partial objective 15 is formed by the surfaces with the surface numbers 22 to 34 and the third partial objective 19 is formed by the surfaces with the surface numbers 36 to 60. The folding mirrors 27 and 29 with the surface numbers 21 and 35 are not assigned to any of the three partial objectives 11, 15 and 19, since the folding mirrors 27 and 29, as plane mirrors, have no influence on the imaging, but rather only deflect the projection light. Even though the folding mirrors 27 and 29 are embodied as plane mirrors, in principle, they can have correction surfaces. The folding mirrors 27 and 29 can be embodied as separate mirrors or are formed by the reflectively coated side surfaces of a monolithic body, for example of a prism with a triangle as base surface.

The projection objective 1 has a numerical aperture of NA=1.55 in the image plane 9. The operating wavelength is 193.306 nm. The extent of the rectangular image field 7 is 26.0 mm×5.5 mm. The image field 7 is at a minimum distance of 2.51 mm from the optical axis 33. The projection objective 1 has an absolute value of the imaging scale of 0.25. It is an immersion projection objective, in the case of which, during operation, decalin (decahydronaphthalene) as immersion liquid is situated between the last lens surface and the object to be exposed, which has a refractive index of 1.65 at a wavelength of 193.306 nm.

The minimum distance between the optically utilized region of the concave mirror 21 and the optically utilized region of the lens surface 25 of the lens 23 arranged adjacent to the concave mirror 21 is 44.6 mm. The optically utilized region of the concave mirror 21 has a diameter of 250.6 mm, and the optically utilized region of the lens surface 25 has a diameter of 199.8 mm. Since the concave mirror 21 has a greater curvature than the lens surface 25, the minimum distance occurs in the plane of symmetry between the edges of the optically utilized regions of the concave mirror 21 and of the lens surface 25.

The distance between the surface vertex of the concave mirror 21 and the surface vertex of the lens 23 adjacent to the concave mirror is 72.9 mm. The vertex radius of the concave mirror 21 is 175.7 mm. The vertex distance is thus less than the vertex radius, in particular less than 70% of the vertex radius.

The concave mirror 21 has a vertex radius of 175.7 mm and a diameter of the optically utilized region of 250.6 mm. The contribution of the concave mirror 21 to the Petzval sum is consequently 2/175.68 $mm^{-1}$=0.011 $mm^{-1}$.

The lens 23 adjacent to the concave mirror is composed of quartz, which, in the event of high radiation loading, exhibits effects such as, for example, material compaction, material rarefaction and polarization-induced birefringence.

Figure 2:
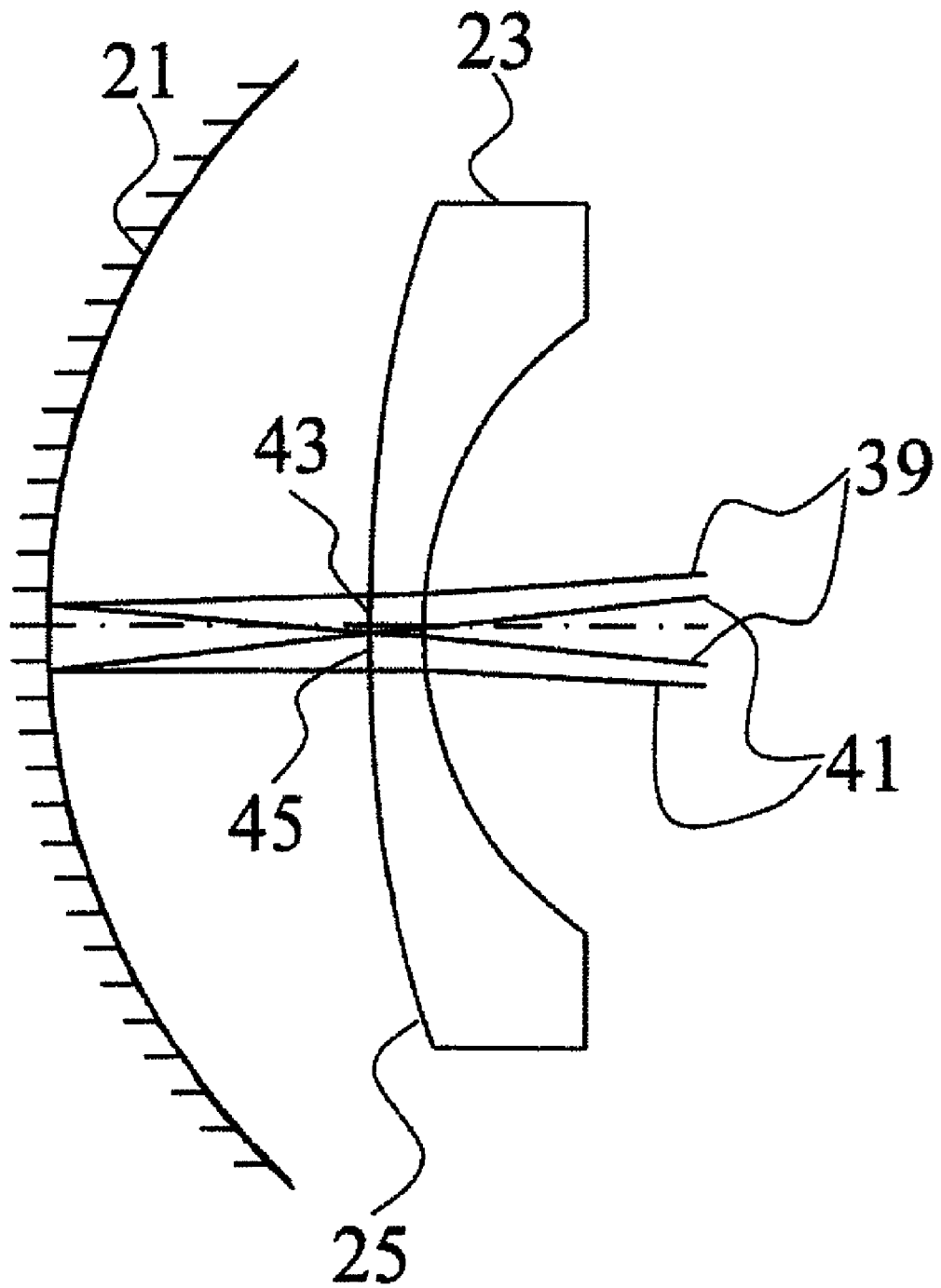
FIG. 2 shows an excerpt from the lens section of the projection objective from FIG. 1 for a first illumination mode.

FIG. 2 shows an excerpt from the lens section from FIG. 1, but with light rays different from those illustrated in FIG. 1. The illustration shows the concave mirror 21 and the lens 23 arranged adjacent to the concave mirror. The illustration additionally shows two aperture rays 39 and 41, which delimit a beam emerging from a circular illumination pole in the entrance pupil of the projection objective in the plane of symmetry and intersect the object plane 5 in a central field point at (x,y)=(0 mm, −20.89 mm). The illumination pole is arranged in the center of the entrance pupil and has in the y-direction an extent of 9.6% of the pupil radius of the entrance pupil. The two aperture rays 39 and 41 have the ray coordinates specified in Table 2.

$$\left[\frac{1}{mm^{2k+2}}\right].$$

In this case, $x_f$ and $y_f$ specify the point of intersection of the aperture ray with the object plane 5 and $x_p$ and $y_p$ specify the relative pupil coordinates of the aperture ray in the entrance pupil of the projection objective 1. The relative pupil coordinates are in this case related to the pupil radius of the entrance pupil, which is defined by the numerical aperture NA=1.55 of the projection objective 1. At $(x_p, y_p)$=(0, 0), the aperture ray would coincide with the principal ray. At $(x_p, y_p)$=(0, 1), the aperture ray would become the marginal ray. It would then pass through the edge of the aperture stop 31 and thus have in the image plane 9 an angle with respect to the principal ray corresponding to the numerical aperture of the projection objective 1. The beam delimited by the two aperture rays 39 and 41 runs on the outgoing and return paths with respect to the concave mirror 21 in the lenses of the second partial objective 15 completely separately from one another. Thus, the beam passes through the lens surface 25 on the outgoing path in the region 43, whereas it passes through the lens surface 25 on the return path in the region 45, which does not overlap the region 43. Owing to a lack of superimposition of the beams on the outgoing and return paths, no doubling of the radiation loading occurs in the lenses of the second partial objective 15 which are passed through twice. The distance between the concave mirror 21 and the lens 23 is thus chosen to be so large that all rays which emerge from an illumination pole in the center of the entrance pupil with an extent of the illumination pole in the y-direction of less than 9.6% of the pupil radius of the entrance pupil and intersect the object plane 5 at a central object point within the object field 3 pass through the surface 25 on the outgoing and return paths in spatially separated regions 43 and 45. Therefore, all rays which emerge from an illumination pole in the center of the entrance pupil with an extent of the illumination pole in the y-direction of less than 8.0% of the pupil radius of the entrance pupil and intersect the object plane 5 at a central object point within the object field 3 also pass through the surface 25 on the outgoing and return paths in spatially separated regions.

Figure 3:
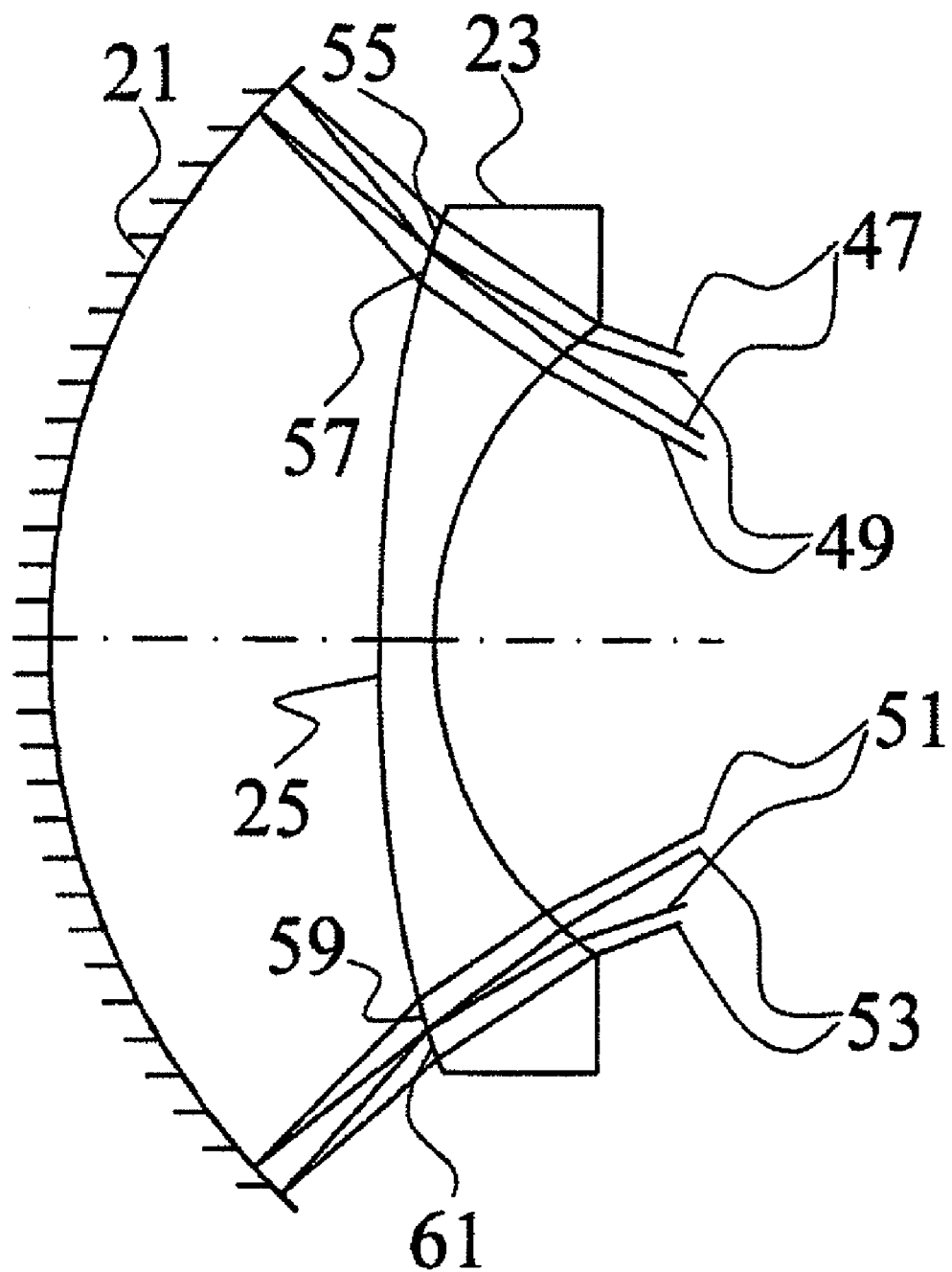
FIG. 3 shows an excerpt from the lens section of the projection objective from FIG. 1 for a second illumination mode.

FIG. 3 shows the same excerpt from the lens section from FIG. 1 as in FIG. 2, but now with four aperture rays 47, 49, 51 and 53, which delimit two beams emerging from two illumination poles in the entrance pupil of the projection objective in the plane of symmetry and intersect the object plane 5 at a central field point at (x,y)=(0 mm, −20.89 mm). The two illumination poles are arranged centrosymmetrically with respect to the center of the entrance pupil at the edge of the entrance pupil and have an extent of illumination pole in the y-direction of 8% of the pupil radius of the entrance pupil. The four aperture rays 47, 49, 51 and 53 have the ray coordinates specified in Table 3.

TABLE 3

| Aperture ray | $x_f$ [mm] | $y_f$ [mm] | $x_p$ | $y_p$ |
|---|---|---|---|---|
| 47 | 0 | −20.89 | 0 | +1.00 |
| 49 | 0 | −20.89 | 0 | +0.92 |
| 51 | 0 | −20.89 | 0 | −0.92 |
| 53 | 0 | −20.89 | 0 | −1.00 |

The beams delimited by the aperture rays 47 and 49, and respectively 51 and 53, run on the outgoing and return paths with respect to the concave mirror 21 in the lenses of the second partial objective 15 completely separately from one another. Thus, the beams pass through the lens surface 25 on the outgoing path in the regions 55 and 59, whereas they pass through the lens surface 25 on the return path in the regions 57 and 61, which do not overlap the regions 55 and 59. Owing to the lack of superimposition of the beams on the outgoing and return paths, no doubling of the radiation loading occurs in the lenses of the second partial objective 15 which are passed through twice. The distance between the concave mirror 21 and the lens 23 is thus chosen to be so large that all rays which emerge from two illumination poles arranged centrosymmetrically with respect to the center of the entrance pupil at the edge of the entrance pupil with an extent of the illumination pole in the y-direction of less than 8% of the pupil radius of the entrance pupil and intersect the object plane 5 at a central object point within the object field 3 pass through the surface 25 on the outgoing and return paths in spatially separated regions 55 and 57, and respectively 59 and 61.

Figure 4:
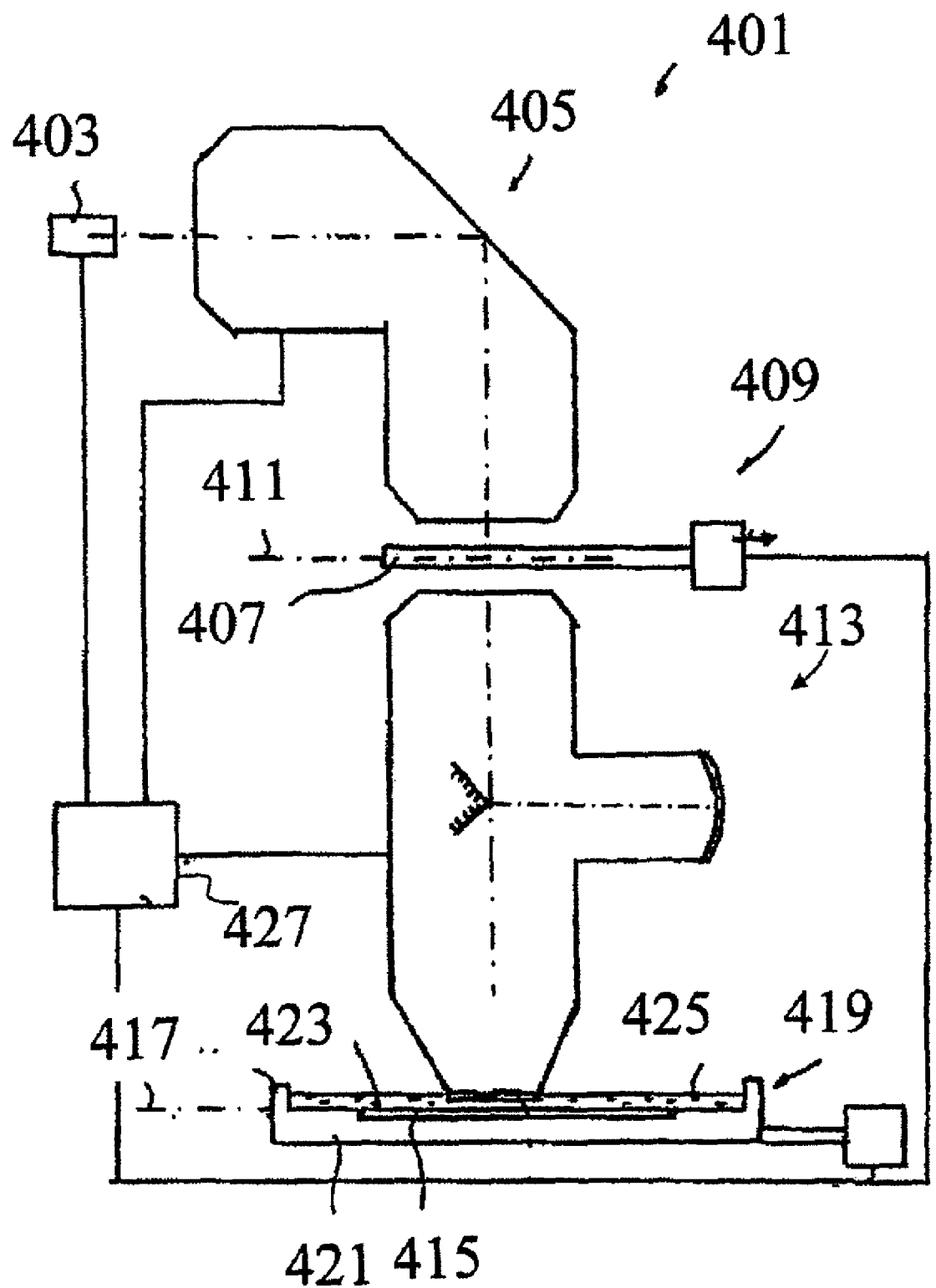
FIG. 4 shows a schematic illustration of a microlithography projection exposure apparatus.

FIG. 4 schematically shows a projection exposure apparatus 401 for microlithography that serves for producing semiconductor components or other finely structured components. The projection exposure apparatus 401 has an excimer laser 403 as light source having an operating wavelength of 193 nm, although other excimer lasers for example having operating wavelengths of 157 nm or 248 nm are also possible. An illumination system 405 disposed downstream generates a sharply bounded, homogeneously illuminated illumination field that is simultaneously adapted with regard to its angular distribution to the requirements of the projection objective 413 disposed downstream.

The illumination system 405 has devices for providing at least one illumination mode and can thereby generate in the exit pupil of the illumination system 405, or in the entrance pupil of the projection objective 413 disposed downstream, for example a so-called conventional illumination with a variable pupil filling factor σ, an annular illumination, a dipole illumination, a quadrupole illumination or a multipole illumination. In the case of the conventional illumination, the entrance pupil of the projection objective is illuminated by an ideally circular illumination pole arranged in centred fashion with respect to the center of the entrance pupil, the radius of which illumination pole relative to the pupil radius of the entrance pupil is specified as the pupil filling factor σ. The illumination extent of the illumination pole in the y-direction then corresponds to twice the pupil filling factor σ. In the case of annular illumination, the entrance pupil of the projection objective is illuminated by an illumination ring arranged in centred fashion with respect to the center of the entrance pupil. In the case of dipole illumination, the entrance pupil is illuminated by two illumination poles arranged centrosymmetrically with respect to the center of the entrance pupil. In the case of quadrupole illumination, the entrance pupil is illuminated by four illumination poles arranged in pairwise fashion centrosymmetrically with respect to the center of the entrance pupil. In the case of multipole illumination, the entrance pupil is illuminated by an even number of illumination poles arranged in pairwise fashion centrosymmetrically with respect to the center of the entrance pupil.

Devices for providing at least one illumination mode are known for example from US 2007/0165202 A1 or WO 2009/080231 A1. In US 2007/0165202 A1 or WO 2009/080231 A1, a two-dimensional arrangement of individually drivable mirrors is used in order to provide a variable illumination in the entrance pupil of the projection objective disposed downstream. By merely redistributing the illumination light of the light source using the two-dimensional arrangement of tiltable mirrors, each illumination mode has approximately the same total power. Consequently, if the extent of an illumination pole is reduced, the surface power density correspondingly rises within the illumination pole.

Alternatively, the illumination mode can also be set by exchanging diffractive optical elements in the illumination system. The diffractive elements produce angular distributions which can be transformed by a Fourier lens arrangement into illumination distributions in the entrance pupil of the projection objective disposed downstream. Such devices for setting at least one illumination mode are known from U.S. Pat. No. 7,551,261 B2, for example. By merely redistributing the illumination light of the light source by exchanging the diffractive optical element, each illumination mode has approximately the same total power. Thus, in a manner similar to that when using drivable mirror arrangements, the surface power density rises within an illumination pole if the extent of the illumination pole is reduced.

A device 409 for holding and manipulating a reticle 407 is arranged downstream of the illumination system 405 in the light direction. The reticle 407, also referred to as a mask, has the structure to be imaged. Using the device 409, the reticle 407 can be moved in a scanning direction for scanning purposes in the object plane 411.

The projection objective 413 is a catadioptric projection objective, as illustrated in FIG. 1 for example. The catadioptric projection objective 413 images that part of the reticle 407 which is illuminated by the illumination system 405 onto the wafer 415 in demagnified fashion. The wafer 415 has a light-sensitive layer that is exposed upon irradiation with the projection light.

The wafer 415 is held by a device 419 that permits a parallel movement of the wafer 415 synchronized with the scanning movement of the reticle. The device 419 also has manipulators that position the wafer 415 optimally in the image plane 417 of the projection objective 413. The device 419 is designed for the immersion use of the projection objective. It has a holding unit 421 having a shallow depression or recess for holding the wafer 415. The holding unit 421 has a peripheral edge 423 in order to prevent the immersion medium 425 from flowing away. In an alternative embodiment, the holding unit has no peripheral edge. In this case, only the optically utilized region between the last optical element of the projection objective and the wafer is merely wetted with the immersion liquid. This enables the immersion liquid to be regularly exchanged.

The projection exposure apparatus is controlled by a central computer unit 427.

In order to produce semiconductor components and other finely structured components with the projection exposure apparatus 401, therefore, provision is made of a reticle 407 having a predetermined pattern in the object plane 411 of the catadioptric projection objective 413, provision is made of a wafer 415 having a light-sensitive layer in the image plane of the catadioptric projection objective 413, the reticle 407 is illuminated by the illumination system 405 and, finally, the illuminated region of the reticle 407 is imaged onto the wafer 415 by with the catadioptric projection objective 413. In this case, an illumination mode is selected depending on the pattern to be imaged and is provided by the illumination system 405. By way of example, a pattern substantially composed of parallel lines is illuminated with an illumination mode in which the entrance pupil of the projection objective 413 is illuminated with a dipole illumination. If the lines in the object plane 411 run parallel to the x-direction, then the two illumination poles are to be arranged on the y axis of the entrance pupil. If a pure phase mask is used as the reticle, then the phase mask is illuminated with an illumination mode in which the entrance pupil of the projection objective 413 is illuminated with a coherent illumination.

Figure 5:
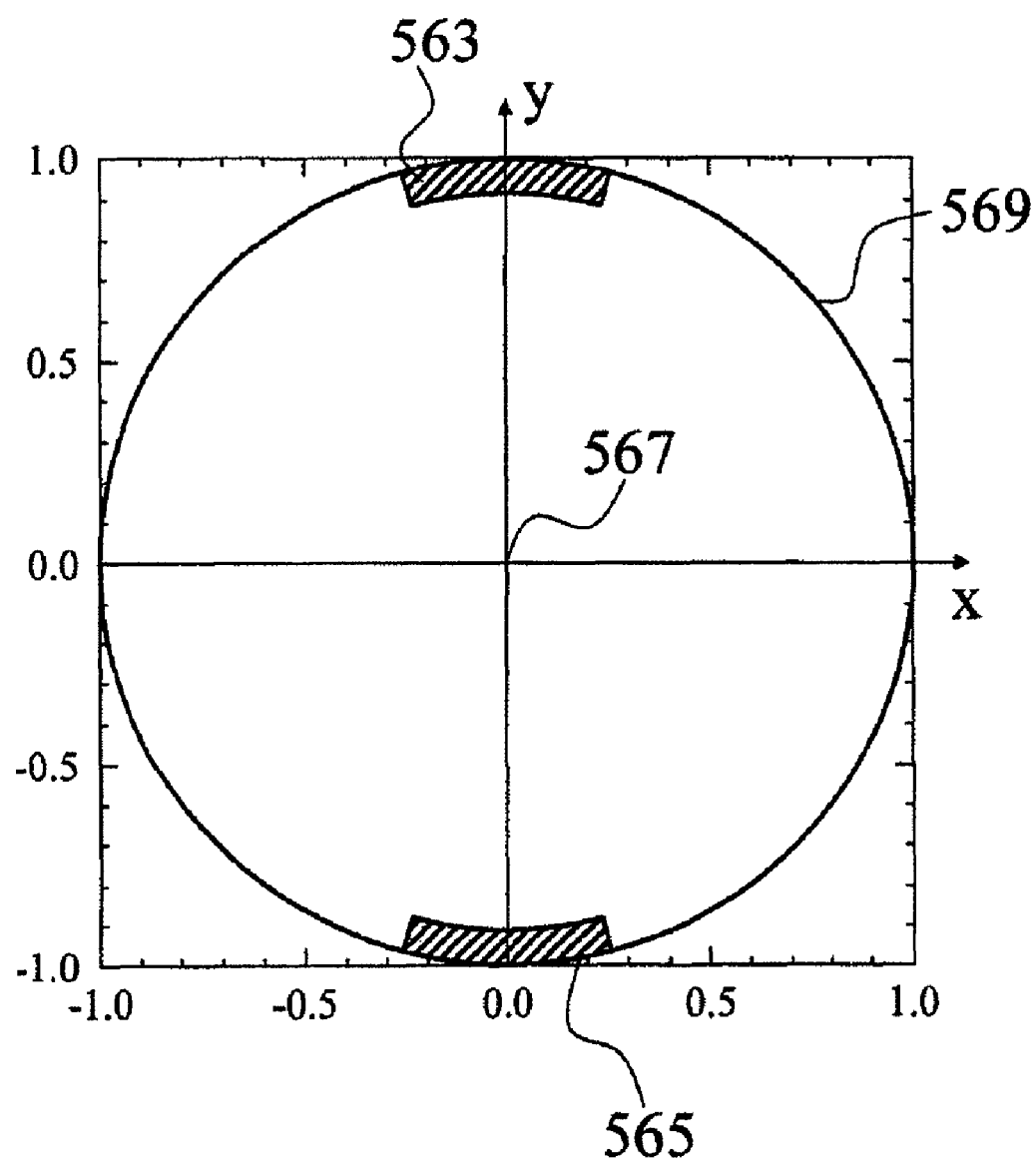
FIG. 5 shows the illumination of the entrance pupil with two illumination poles.

FIG. 5 shows, for an illumination mode, the dipole illumination of the entrance pupil of the projection objective 1 with two illumination poles 563 and 565. The illumination poles are arranged centrosymmetrically with respect to the center 567 of the entrance pupil at the edge of the entrance pupil. The entrance pupil is illustrated with a pupil radius 569 normalized to 1.0. The illumination poles 563 and 565 have a step-like intensity profile, such that the intensity within the illumination poles is 100% of the maximum intensity, and the intensity outside the illumination poles is 0%. The 10% points therefore also lie on the boundary line of the illumination poles, such that the extent in the y-direction specifies the maximum distance between the boundary lines in the y-direction. The illumination poles 563 and 565 each have the form of an annular segment. The segment encloses an angle of 30° and has an extent in the y-direction of 8.5% of the pupil radius of the entrance pupil. The total power of the two illumination poles 563 and 565 is 1.5 W.

Figure 6:
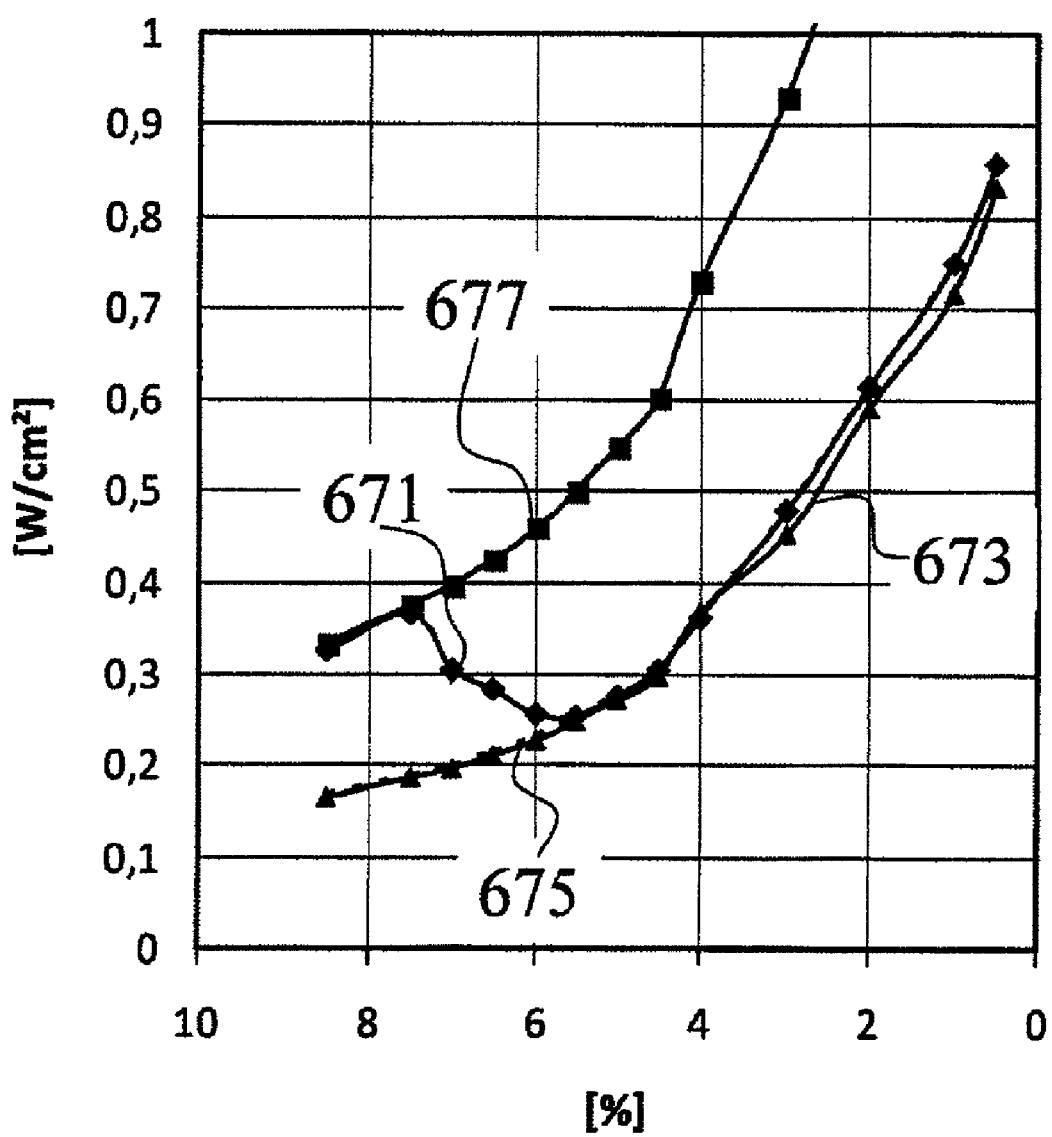
FIG. 6 shows the maximum surface power density on the lens surface adjacent to the concave mirror as a function of the extent of the illumination pole in the y-direction of the illumination pole for the projection objective from FIG. 1.

The illumination system 405 is able to vary the extent of the illumination pole in the y-direction depending on the illumination mode. In order that the throughput of the projection exposure apparatus 401 is independent of the illumination mode, the illumination mode is changed virtually without any losses. Consequently, the total power integrated over the entire illumination field remains virtually constant when the illumination mode is changed. This then has the effect, however, that with a decreasing extent of the illumination pole in the y-direction, the surface power density correspondingly rises. FIG. 6 shows, for the lens surface 25 from FIG. 1, the profile 671 of the maximum surface power density as a function of the extent of the illumination pole in the y-direction for a dipole illumination such as is illustrated in FIG. 5 for an extent of the illumination pole in the y-direction of 8.5% of the pupil radius of the entrance pupil.

The illumination field in the object plane 5 is rectangular and has the corner points (x=−52 mm, y=−9.89 mm), (x=+52 mm, y=−9.89 mm), (x=−52 mm, y=−31.89 mm) and (x=+52 mm, y=−31.89 mm). The intensity profile in the object plane 5 is constant in the x-direction and has in the y-direction relative to the maximum intensity between y=−9.89 mm and y=−20.89 mm a linear rise from 0% to 100% and between y=−20.89 mm and y=−31.89 mm a linear fall from 100% to 0%. Consequently, the intensity profile is triangular in the y-direction. The total power integrated over the entire illumination field is 1.5 W. Between the object plane 5 and the lens surface 25, the intensity loss on account of absorption losses in the material and reflection losses at the lens surfaces and also the mirror surfaces of the plane mirrors is approximately 20%, such that the total power integrated over the entire lens surface 25 is 1.2 W. The dipole illuminations for the individual data points of the curve 671 differ merely in the extent of the illumination pole in the y-direction. The segment angle of 30° and the fact that the illumination poles are arranged at the edge of their entrance pupil are otherwise unchanged. The profile 671 of the maximum surface power density exhibits a significant fall in the case of an extent of the illumination pole in the y-direction of 7.5% of the pupil radius of the entrance pupil. Said significant fall is caused by the fact that the beams on the outgoing and return paths begin to separate for pole extents in the y-direction of less than 7.5% of the pupil radius of the entrance pupil. The profile 673, illustrated as a solid line with triangles, shows the maximum surface power density on the outgoing path and the profile 675, illustrated as a dashed line, shows the maximum surface power density on the return path of the beams associated with the two illumination poles. The two profiles practically lie on top of one another. The curve 677 represents the sum of these two profiles. If the beams are superimposed on the outgoing and return paths, the maximum surface power densities are also added, as is shown by the profile 671 up to an extent of the illumination pole in the y-direction of 7.5% of the pupil radius of the entrance pupil. For pole extents in the y-direction of less than 5.5% of the pupil radius of the entrance pupil, the beams are completely separated on the outgoing and return paths, such that the profile 671 coincides with the profile 673, and respectively 675. The fluid transition between an extent of the illumination pole in the y-direction of 7.5% and 5.5% of the pupil radius of the entrance pupil is caused by the extended illumination field, whereby the beams separate only gradually on the outgoing and return paths. This also explains why, in accordance with FIG. 3, for a central field point, the beams on the outgoing and return paths already separate in the case of an extent of the illumination pole in the y-direction of 8% of the pupil radius of the entrance pupil, whereas in the case of an extended field illumination the separation only becomes visible in the case of an extent of the illumination pole in the y-direction of 7.5% of the pupil radius of the entrance pupil.

The profile 671 of the surface power density shows how, by increasing the distance between the concave mirror 21 and the lens 23 adjacent to the concave mirror, it is possible to reduce the surface power density on the lens surface 25 for pupil illuminations with pole extents in the y-direction of less than or equal to 8% of the pupil radius of the entrance pupil. It is thereby possible to further reduce the pole extents in the y-direction, without the maximum surface power density rising further and damage to the lens 23 occurring. Only in this manner does it become possible to provide such illumination modes using the illumination system without having to fear that the projection objective will incur radiation damage.

In the case of a total power of the illumination light in the reticle plane of 1.5 W, the maximum surface power density on the lens surface 23 for all pole extents in the y-direction up to a minimum value of 2.1% remains less than 0.6 W/cm$^2$. For even smaller pole extents in the y-direction, the surface power density exceeds the value of 0.6 W/cm$^2$ on account of the fact that the total power is concentrated on ever smaller illumination poles.

Figure 7:
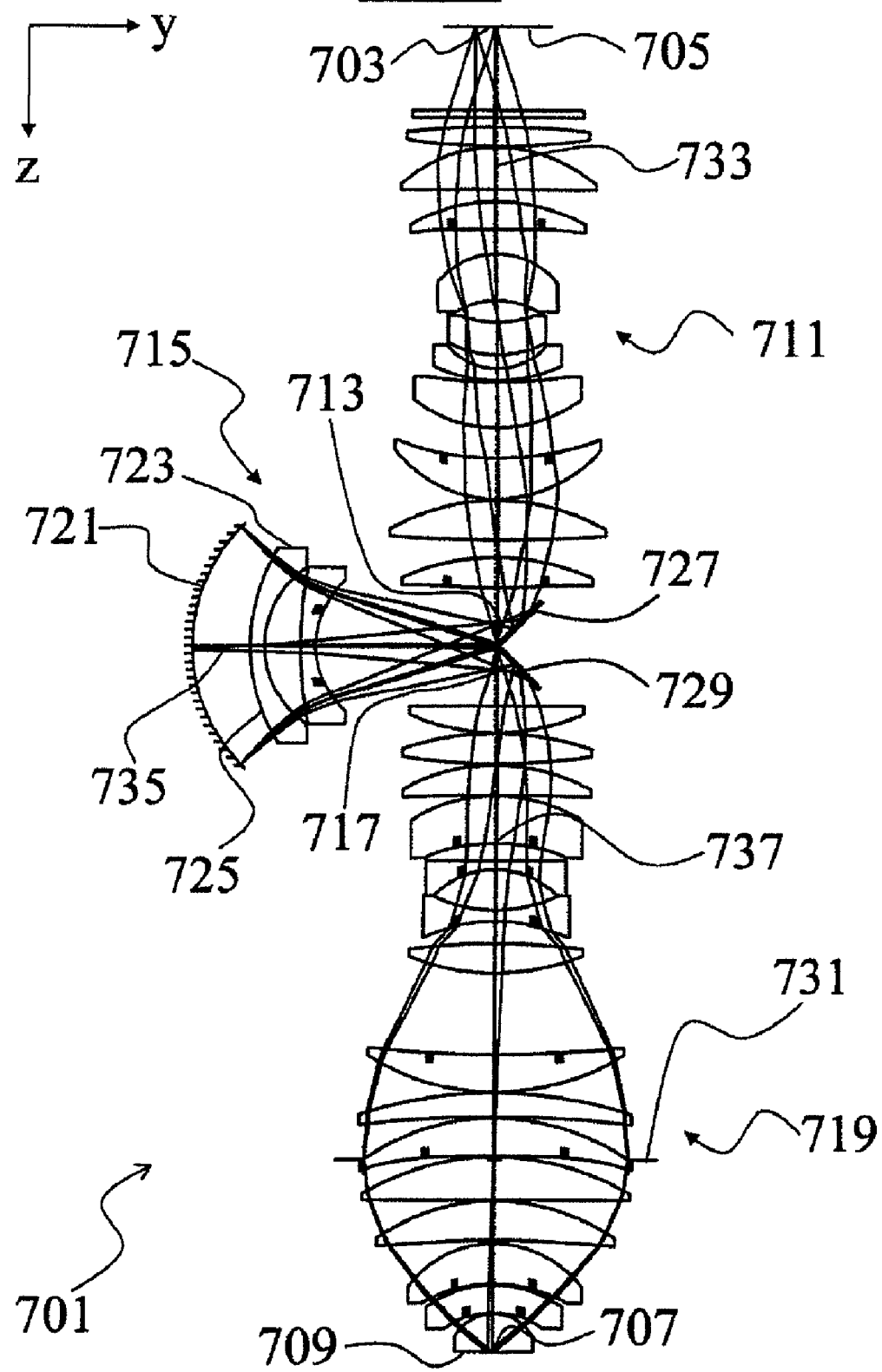
FIG. 7 shows a lens section of a catadioptric projection objective.

FIG. 7 shows a lens section of a further exemplary embodiment of a catadioptric projection objective 701. The elements in FIG. 7 which correspond to the elements from FIG. 1 have the same reference signs as in FIG. 1 increased by the number 700. For a description of these elements, reference is made to the description concerning FIG. 1. The optical data for the projection objective 701 are compiled in Table 4. Quartz (SiO2) is used as lens materials in all lenses.

The first partial objective 711 is formed by the surfaces with the surface numbers 1 to 22, the second partial objective 715 is formed by the surfaces with the surface numbers 24 to 32, and the third partial objective 719 is formed by the surfaces with the surface numbers 34 to 64.

The projection objective 701 has a numerical aperture of NA=1.2 in the image plane 709. The operating wavelength is 193.306 nm. The extent of the rectangular image field 707 is 22.0 mm×5.0 mm. The image field 707 is at a minimum distance of 4.2 mm from the optical axis 733. The projection objective 701 has an absolute value of the imaging scale of 0.25. It is an immersion projection objective, in the case of which, during operation, ultrapure water as immersion liquid is situated between the last lens surface and the object to be exposed.

The minimum distance between the optically utilized region of the concave mirror 721 and the optically utilized region of the lens surface 725 of the lens 723 arranged adjacent to the concave mirror 721 is 44.8 mm. In this case, the optically utilized region of the concave mirror 721 has a diameter of 252.0 mm, and the optically utilized region of the lens surface 725 has a diameter of 198.2 mm. Since the concave mirror 721 has a greater curvature than the lens surface 725, the minimum distance occurs in the plane of symmetry between the edges of the optically utilized regions of the concave mirror 721 and of the lens surface 725.

The distance between the surface vertex of the concave mirror 721 and the surface vertex of the lens 723 adjacent to the concave mirror is 60.8 mm. The vertex radius of the concave mirror 721 is 179.4 mm. The vertex distance is thus less than the vertex radius, in particular less than 70% of the vertex radius.

The concave mirror 721 has a vertex radius of 179.4 mm and a diameter of the optically utilized region of 252 mm. The contribution of the concave mirror 721 to the Petzval sum is consequently 2/179.4 mm$^{-1}$=0.011 mm$^{-1}$.

The lens 723 adjacent to the concave mirror is composed of quartz.

On account of the distance between the concave mirror 721 and the lens 723, all rays which emerge from an illumination pole in the center of the entrance pupil with an extent of the illumination pole in the y-direction of less than 15.6% of the pupil radius of the entrance pupil and intersect the object plane 705 at a central object point at (x=0 mm, y=−26.8 mm) within the object field 703 pass through the surface 725 on the outgoing and return paths in spatially separated regions.

If the rays emerge from two illumination poles arranged centrosymmetrically with respect to the center of the entrance pupil at the edge of the entrance pupil with an extent of the illumination pole in the y-direction of less than 10% of the pupil radius of the entrance pupil and if they intersect the object plane 705 at the central object point within the object field 703, then these rays pass through the surface 725 on the outgoing and return paths likewise in spatially separated regions.

Figure 8:
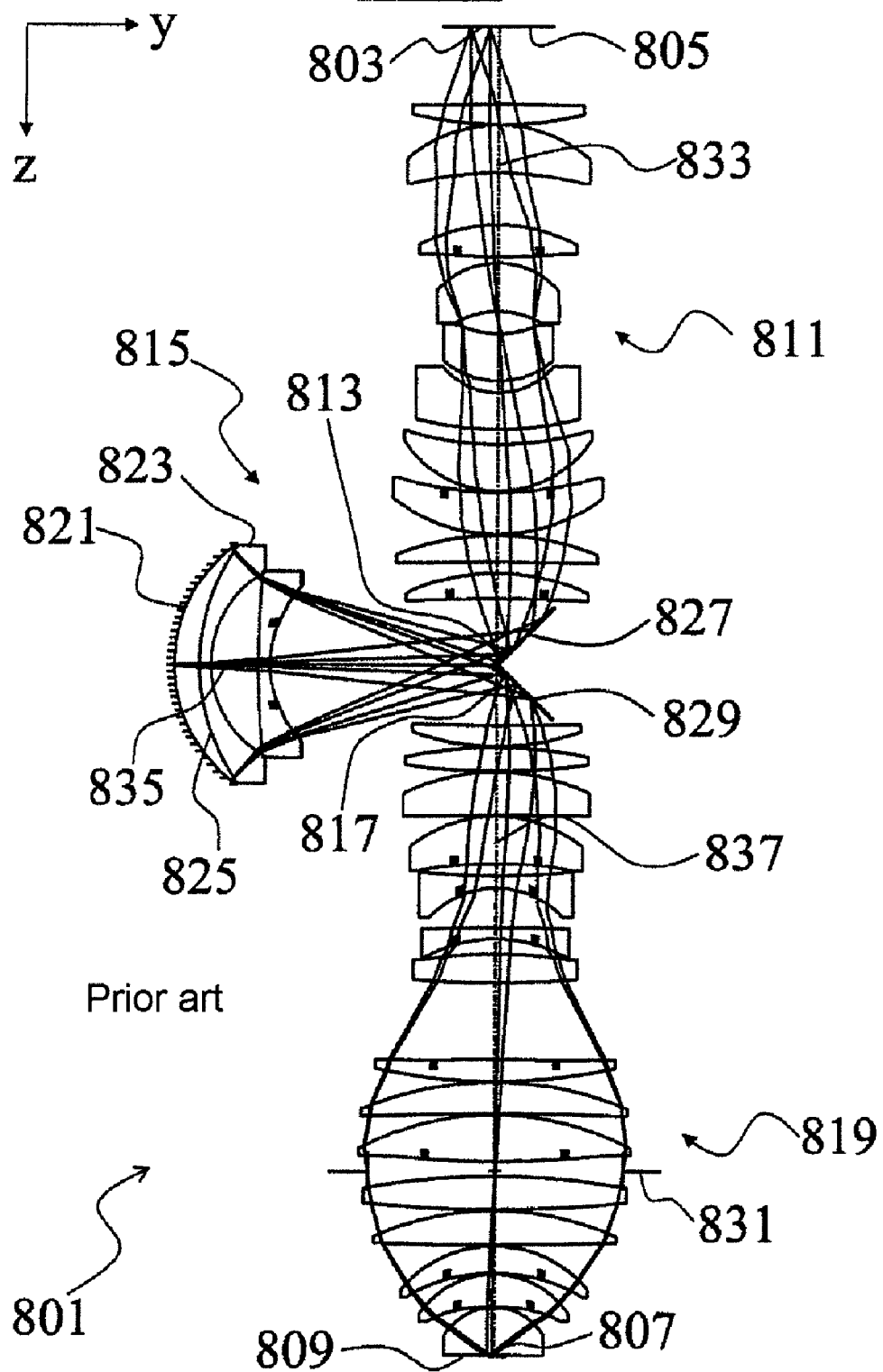
FIG. 8 shows a lens section of a catadioptric projection objective according to the prior art.

FIG. 8 shows for comparison a lens section of a catadioptric projection objective 801 known from the prior art. The optical design of the projection objective 801 is taken from the patent application US 2005/0248856 A1 by Omura et al., published on 10 Nov. 2005, and corresponds to FIG. 19 therein. The optical data of the design are specified in Tables 9 and 10 in US 2005/0248856 A1. Therefore, for a more detailed description of the optical design of the projection objective 1, reference is made to US 2005/0248856 A1.

The elements in FIG. 8 which correspond to the elements from FIG. 1 have the same reference signs as in FIG. 1 increased by the number 800. For a description of these elements, reference is made to the description concerning FIG. 1.

The projection objective 801 has a numerical aperture of NA=1.25 in the image plane 809. The operating wavelength is 193.306 nm. The extent of the rectangular image field 807 is 26.0 mm×4.0 mm. The image field 807 is at a minimum distance of 3.5 mm from the optical axis 833. The projection objective 801 has an absolute value of the imaging scale of 0.25.

The minimum distance between the optically utilized region of the concave mirror 821 and the optically utilized region of the lens surface 825 of the lens 823 arranged adjacent to the concave mirror 821 is only 3.5 mm.

The distance between the surface vertex of the concave mirror 821 and the surface vertex of the lens 823 adjacent to the concave mirror 821 is only 26.2 mm.

The lens 823 adjacent to the concave mirror is composed of quartz, which, in the event of high radiation loading, exhibits effects such as, for example, material compaction, material rarefaction and polarization-induced birefringence.

Figure 9:
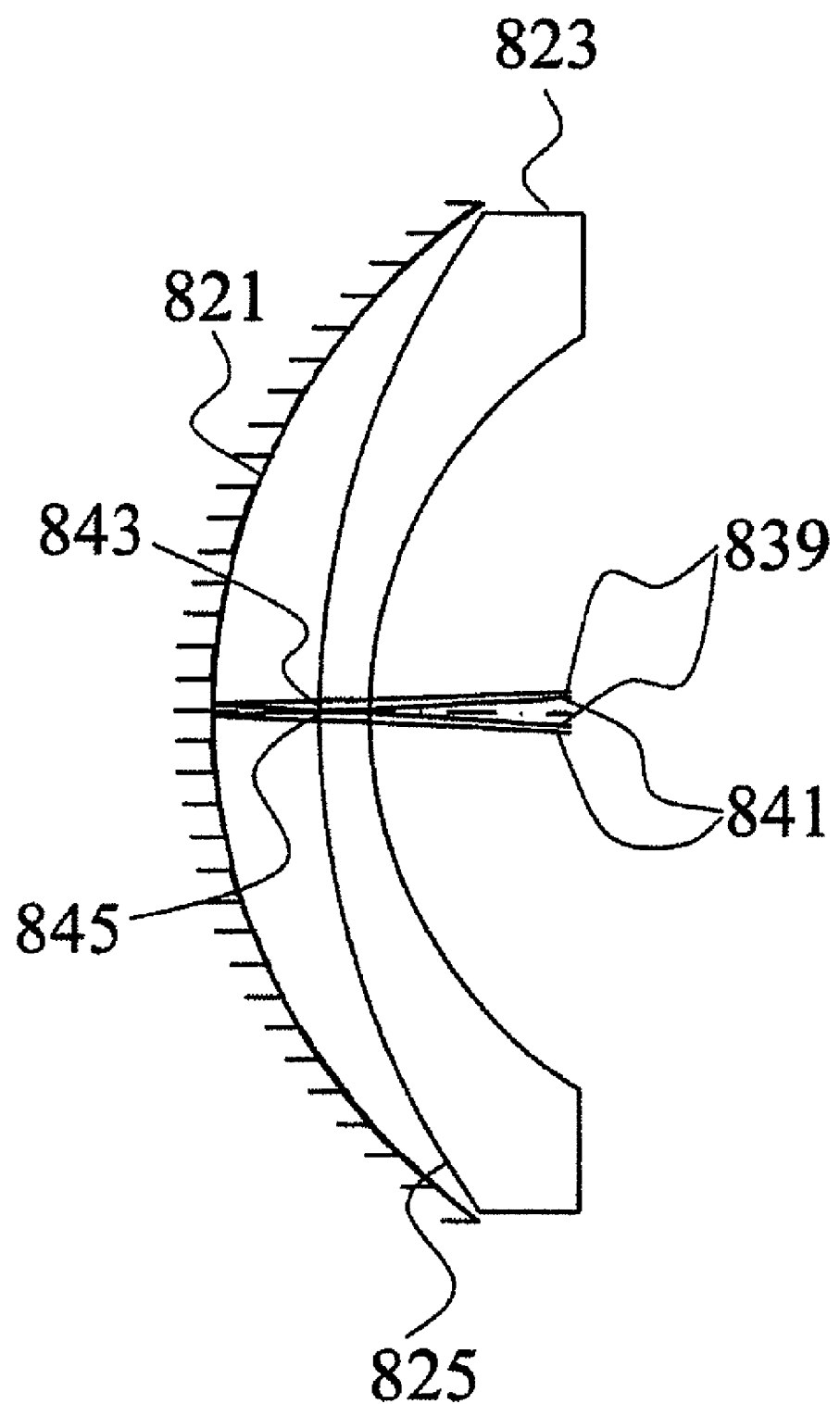
FIG. 9 shows an excerpt from the lens section of the projection objective from FIG. 8 for a first illumination mode.

FIG. 9 shows an excerpt from the lens section from FIG. 8, but with light rays different from those illustrated in FIG. 8. The illustration shows the concave mirror 821 and the lens 823 arranged adjacent to the concave mirror. The illustration additionally shows two aperture rays 839 and 841, which delimit a beam emerging from a circular illumination pole in the entrance pupil of the projection objective in the plane of symmetry and intersect the object plane 805 in a central field point at (x,y)=(0 mm, −22 mm). The illumination pole is arranged in the center of the entrance pupil and has in the y-direction an extent of 2% of the pupil radius of the entrance pupil. The two aperture rays 839 and 841 have the ray coordinates specified in Table 5.

TABLE 5

| Aperture ray | $x_f$ [mm] | $y_f$ [mm] | $x_p$ | $y_p$ |
|---|---|---|---|---|
| 839 | 0 | −22.0 | 0 | +0.01 |
| 841 | 0 | −22.0 | 0 | −0.01 |

The beam delimited by the two aperture rays 839 and 841 consequently runs on the outgoing and return paths with respect to the concave mirror 821 in the lenses of the second partial objective 815 completely separately from one another only when, in the case of a conventional illumination, the extent of the illumination pole in the y-direction is less than 2% of the pupil radius of the entrance pupil. By contrast, if the extent of the illumination pole in the y-direction is greater than 2% of the pupil radius of the entrance pupil, the beams on the outgoing and return paths are superimposed. This leads to a doubled maximum surface power density on the lens surface 825.

Figure 10:
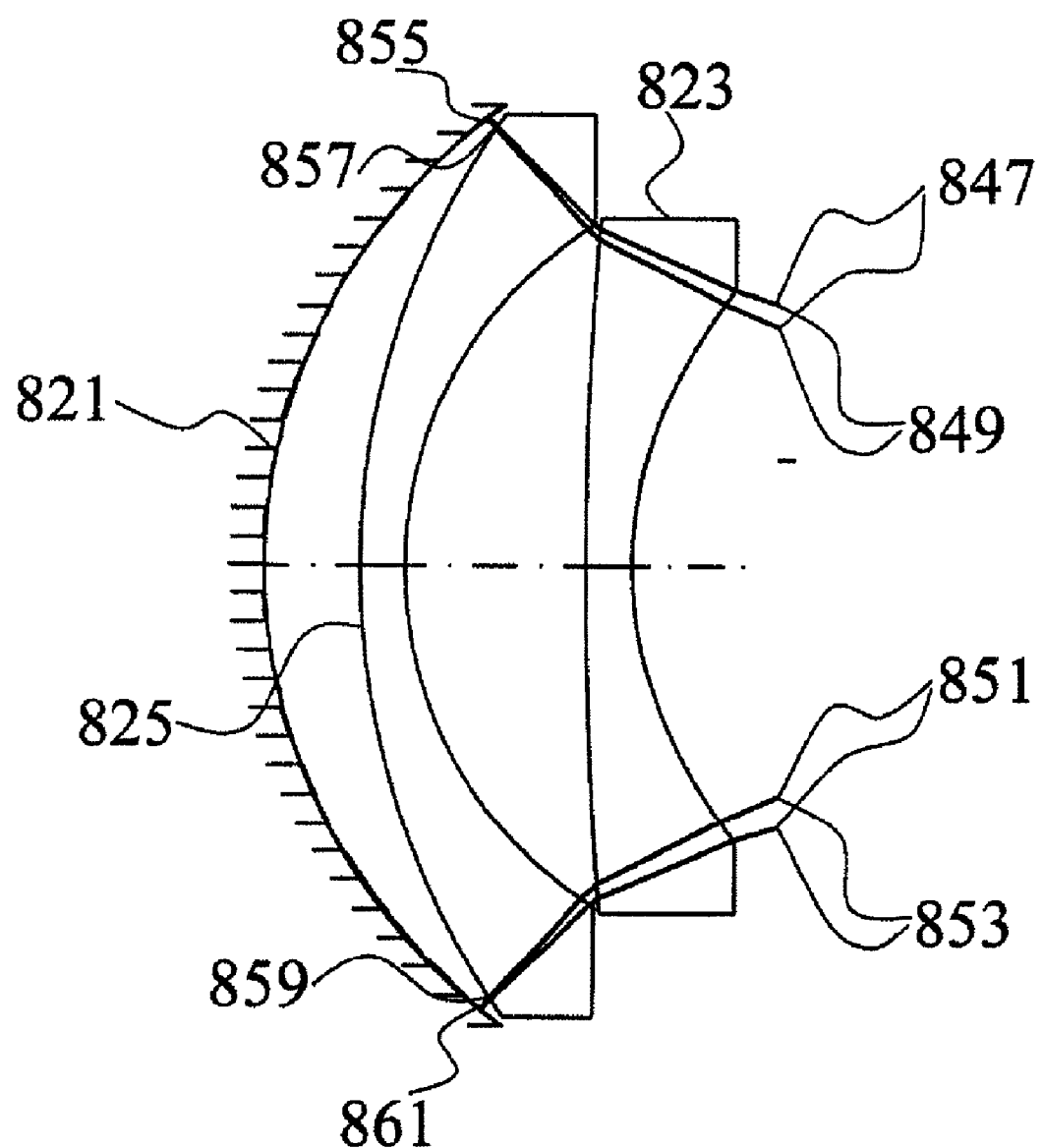
FIG. 10 shows an excerpt from the lens section of the projection objective from FIG. 8 for a second illumination mode.

FIG. 10 shows the same excerpt from the lens section from FIG. 8 as in FIG. 9, but now with four aperture rays 847, 849, 851 and 853, which delimit two beams emerging from two illumination poles in the entrance pupil of the projection objective in the plane of symmetry and intersect the object plane 805 at a central field point at (x,y)=(0 mm, −22 mm). The two illumination poles are arranged centrosymmetrically with respect to the center of the entrance pupil at the edge of the entrance pupil and have an extent of the illumination pole in the y-direction of just 0.3% of the pupil radius of the entrance pupil. The four aperture rays 847, 849, 851 and 853 have the ray coordinates specified in Table 6.

TABLE 6

| Aperture ray | $x_f$ [mm] | $y_f$ [mm] | $x_p$ | $y_p$ |
|---|---|---|---|---|
| 847 | 0 | −22.0 | 0 | +1.00 |
| 849 | 0 | −22.0 | 0 | +0.997 |
| 851 | 0 | −22.0 | 0 | −0.997 |
| 853 | 0 | −22.0 | 0 | −1.00 |

On account of the very small extent of the illumination pole in the y-direction, the aperture rays 847 and 849, and respectively 851 and 853, which delimit the two beams cannot be resolved in FIG. 10, but rather appear to lie on top of one another. The beams delimited by the aperture rays 847 and 849, and respectively 851 and 853, consequently run on the outgoing and return paths with respect to the concave mirror 821 in the lenses of the second partial objective 815 completely separately from one another only when, in the case of a dipole illumination, the extent of the illumination pole in the y-direction is less than 0.3% of the pupil radius of the entrance pupil. The beams then pass through the lens surface 825 on the outgoing path in the regions 855 and 859, whereas they pass through the lens surface 825 on the return path in the regions 857 and 861, which do not overlap the regions 855 and 859. By contrast, if the extent of the illumination pole in the y-direction is greater than 0.3% of the pupil radius of the entrance pupil, the beams on the outgoing and return paths are superimposed. This consequently leads to a doubled maximum surface power density on the lens surface 825. If the projection objective known from the prior art in FIG. 8 is compared with the projection objective in FIG. 1 or with the projection objective in FIG. 7, the maximum surface power density on the lens surface adjacent to the concave mirror in the case of illumination poles with extents in the y-direction of between 8% and 0.3% of the pupil radius of the entrance pupil is approximately twice as high in the case of the projection objective in FIG. 8 as in the case of the projection objective in FIG. 1 or in the case of the projection objective in FIG. 7.

Even though the invention has been described on the basis of specific embodiments, numerous variations and alternative embodiments are evident to the person skilled in the art, for example through combination and/or exchange of features of individual embodiments. For the person skilled in the art, such variations and alternative embodiments are also encompassed by the present invention, and the scope of the invention is restricted only by the broadest reasonable meanings of the various terms expressly recited in the accompanying patent claims and the equivalents thereof.

TABLE 1

NA 1.55
Object height 61 mm
Wavelength 193.306 nm

| Surface number | Radius [mm] | Thickness [mm] | Material | Refractive index | Half diameter [mm] |
|---|---|---|---|---|---|
| 0 | 0.000000 | 47.794875 | | | 61.0 |
| 1 | −244.962765 | 51.161778 | SiO2 | 1.560482 | 75.3 |
| 2 | −195.226530 | 0.999781 | | | 93.2 |
| 3 | −1090.564223 | 34.115847 | SiO2 | 1.560482 | 100.7 |
| 4 | −211.851225 | 0.999543 | | | 103.8 |
| 5 | 163.003445 | 58.162383 | SiO2 | 1.560482 | 110.8 |
| 6 | −447.364142 | 53.977198 | | | 109.6 |
| 7 | 188.040171 | 33.629189 | SiO2 | 1.560482 | 81.3 |
| 8 | −583.614550 | 0.998995 | | | 77.5 |
| 9 | 116.746254 | 29.965717 | SiO2 | 1.560482 | 58.7 |
| 10 | 134.199320 | 14.164242 | | | 45.2 |
| 11 | −414.063602 | 9.998310 | SiO2 | 1.560482 | 46.6 |
| 12 | 150.685005 | 18.505058 | | | 52.4 |
| 13 | −606.864540 | 20.302632 | SiO2 | 1.560482 | 58.4 |
| 14 | −224.332242 | 26.838910 | | | 67.3 |

TABLE 1-continued

NA 1.55
Object height 61 mm
Wavelength 193.306 nm

| | | | | | |
|---|---|---|---|---|---|
| 15 | −201.233743 | 52.080218 | SiO2 | 1.560482 | 82.9 |
| 16 | −150.742592 | 8.061535 | | | 103.0 |
| 17 | −277.075262 | 40.156492 | SiO2 | 1.560482 | 116.7 |
| 18 | −157.460101 | 0.999588 | | | 121.4 |
| 19 | −1971.050960 | 65.862812 | SiO2 | 1.560482 | 133.4 |
| 20 | −177.372827 | 70.998986 | | | 137.6 |
| 21 | 0.000000 | −137.474053 | Mirror | | 118.4 |
| 22 | −183.715131 | −70.364808 | SiO2 | 1.560482 | 128.4 |
| 23 | 787.561065 | −148.151675 | | | 125.9 |
| 24 | 180.919317 | −12.500000 | SiO2 | 1.560482 | 76.2 |
| 25 | −226.313061 | −63.958780 | | | 74.8 |
| 26 | 86.610886 | −12.500000 | SiO2 | 1.560482 | 75.8 |
| 27 | 453.097634 | −72.930492 | | | 99.9 |
| 28 | 175.681861 | 72.930492 | Mirror | | 125.3 |
| 29 | 453.097634 | 12.500000 | SiO2 | 1.560482 | 99.9 |
| 30 | 86.610886 | 63.958780 | | | 75.8 |
| 31 | −226.313061 | 12.500000 | SiO2 | 1.560482 | 74.8 |
| 32 | 180.919317 | 148.151675 | | | 76.2 |
| 33 | 787.561065 | 70.364808 | SiO2 | 1.560482 | 125.9 |
| 34 | −183.715131 | 137.474053 | | | 128.4 |
| 35 | 0.000000 | −75.832953 | Mirror | | 115.9 |
| 36 | −242.513705 | −57.229611 | SiO2 | 1.560482 | 129.7 |
| 37 | 1024.016254 | −0.999702 | | | 128.5 |
| 38 | −285.984456 | −23.555220 | SiO2 | 1.560482 | 120.4 |
| 39 | −498.793715 | −0.999696 | | | 117.0 |
| 40 | −145.793494 | −54.157428 | SiO2 | 1.560482 | 105.6 |
| 41 | −136.210768 | −52.060963 | | | 84.1 |
| 42 | 161.089236 | −9.998741 | SiO2 | 1.560482 | 82.3 |
| 43 | −115.544776 | −52.787261 | | | 76.8 |
| 44 | 218.076165 | −10.256130 | SiO2 | 1.560482 | 80.6 |
| 45 | 949.344262 | −6.545103 | | | 93.5 |
| 46 | −309.807459 | −44.296223 | SiO2 | 1.560482 | 119.0 |
| 47 | 539.429063 | −23.767591 | | | 126.2 |
| 48 | 400.682019 | −57.425517 | SiO2 | 1.560482 | 133.4 |
| 49 | 168.022626 | −0.998167 | | | 139.7 |
| 50 | −806.995577 | −56.763158 | SiO2 | 1.560482 | 159.4 |
| 51 | 372.983165 | −10.271350 | | | 160.0 |
| 52 | −374.196040 | −52.460555 | SiO2 | 1.560482 | 152.8 |
| 53 | 2429.402092 | −37.953634 | | | 148.7 |
| 54 | 0.000000 | 36.954190 | | | 136.3 |
| 55 | −178.265659 | −70.669205 | SiO2 | 1.560482 | 132.7 |
| 56 | −6393.827291 | −0.996916 | | | 126.9 |
| 57 | −144.858312 | −34.812975 | SiO2 | 1.560482 | 97.5 |
| 58 | −603.727850 | −0.991203 | | | 91.7 |
| 59 | −72.803116 | −59.386695 | Spinel | 1.910000 | 60.8 |
| 60 | 0.000000 | −3.000000 | Decalin | 1.650000 | 23.6 |
| 61 | 0.000000 | 0.000000 | | | 15.25 |

Aspherical constants

| Surface number | 1 | 5 | 11 | 14 | 15 |
|---|---|---|---|---|---|
| K | 0 | 0 | 0 | 0 | 0 |
| C1 | −2.576153E−08 | −6.148397E−08 | 1.612394E−07 | 2.056081E−07 | 5.584741E−08 |
| C2 | −7.296726E−12 | −4.140256E−13 | −5.129009E−11 | −1.159309E−11 | −8.405726E−12 |
| C3 | 4.989306E−16 | −4.800573E−17 | 1.777178E−14 | 4.188700E−16 | 2.456959E−16 |
| C4 | −7.271622E−20 | 2.247954E−21 | −1.351910E−17 | 2.941375E−19 | 5.568750E−20 |
| C5 | 6.671147E−24 | −1.174203E−25 | 4.462554E−21 | −5.371191E−23 | −6.407521E−24 |
| C6 | −4.034114E−28 | 1.437728E−30 | −6.004840E−25 | 3.483403E−27 | 4.901755E−28 |

| Surface number | 19 | 23 | 27 | 29 | 33 |
|---|---|---|---|---|---|
| K | 0 | 0 | 0 | 0 | 0 |
| C1 | −3.994058E−08 | −1.529005E−08 | 6.672168E−08 | 6.672168E−08 | −1.529005E−08 |
| C2 | 7.372302E−13 | −2.025809E−13 | −3.653343E−12 | −3.653343E−12 | −2.025809E−13 |
| C3 | −9.861411E−18 | 9.344116E−18 | 3.385794E−16 | 3.385794E−16 | 9.344116E−18 |
| C4 | 2.967890E−23 | −2.074209E−22 | −2.208115E−20 | −2.208115E−20 | −2.074209E−22 |
| C5 | −2.728891E−27 | 4.433301E−27 | 9.174598E−25 | 9.174598E−25 | 4.433301E−27 |
| C6 | −9.464359E−33 | −6.989520E−32 | −9.467958E−30 | −9.467958E−30 | −6.989520E−32 |

TABLE 1-continued

NA 1.55
Object height 61 mm
Wavelength 193.306 nm

| Surface number | 37 | 42 | 45 | 46 | 48 |
|---|---|---|---|---|---|
| K | 0 | 0 | 0 | 0 | 0 |
| C1 | −5.543989E−09 | −9.245851E−08 | −7.973847E−08 | 6.124459E−08 | 3.983624E−08 |
| C2 | 3.078932E−13 | 6.623016E−12 | −4.004034E−12 | −3.034136E−12 | −1.410413E−12 |
| C3 | −5.163818E−18 | −1.321657E−15 | −2.173907E−18 | 2.103620E−16 | 3.848139E−17 |
| C4 | −4.572213E−23 | 1.368364E−19 | 2.255617E−20 | −8.737347E−21 | −1.337320E−21 |
| C5 | 1.166704E−27 | −8.148141E−24 | −1.082993E−25 | 2.562852E−25 | −6.534806E−26 |
| C6 | 1.129527E−32 | 2.185634E−28 | 2.178891E−29 | −3.901187E−30 | 2.565663E−30 |

| Surface number | 51 | 53 | 56 | 58 |
|---|---|---|---|---|
| K | 0 | 0 | 0 | 0 |
| C1 | −1686740E−08 | 1.604290E−08 | 1.232168E−09 | 2.109553E−08 |
| C2 | 5.562570E−13 | −2.355117E−12 | −1.170930E−12 | −1.248697E−11 |
| C3 | −8.279017E−18 | 1.072658E−16 | 2.088290E−16 | 1.154742E−15 |
| C4 | 5.443120E−23 | −3.706666E−21 | −1.528390E−20 | −9.813656E−20 |
| C5 | −1.071084E−26 | 9.541418E−26 | 5.023293E−25 | 4.997548E−24 |
| C6 | 2.502642E−31 | −1.090663E−30 | −6.670574E−30 | −1.298417E−28 |

| Decentring and tilt | | | | | |
|---|---|---|---|---|---|
| Surface number | Δx [mm] | Δy [mm] | Δz [mm] | alpha [°] | beta [°] |
| 21 | 0 | 0 | 0 | 45 | 0 |
| 35 | 0 | 0 | 0 | 45 | 0 |

TABLE 4

NA 1.2
Object height 57.27 mm
Wavelength 193.306 nm

| Surface number | Radius [mm] | Thickness [mm] | Material | Refractive index | Half diameter [mm] |
|---|---|---|---|---|---|
| 0 | 0.000000 | 88.597820 | | | 57.3 |
| 1 | 0.000000 | 8.000000 | SiO2 | 1.560326 | 85.2 |
| 2 | 0.000000 | 9.547207 | | | 86.8 |
| 3 | 995.775206 | 20.538688 | SiO2 | 1.560326 | 91.1 |
| 4 | −678.888990 | 1.076031 | | | 92.7 |
| 5 | 159.047562 | 44.618722 | SiO2 | 1.560326 | 100.1 |
| 6 | 5717.606183 | 12.720163 | | | 98.3 |
| 7 | 193.315102 | 29.440470 | SiO2 | 1.560326 | 89.1 |
| 8 | −1636.321839 | 26.246551 | | | 85.5 |
| 9 | 84.326027 | 48.503457 | SiO2 | 1.560326 | 61.0 |
| 10 | 85.284845 | 22.846193 | | | 39.6 |
| 11 | −115.891347 | 34.476438 | SiO2 | 1.560326 | 34.6 |
| 12 | −110.632672 | 15.236178 | | | 48.1 |
| 13 | −67.851993 | 12.773603 | SiO2 | 1.560326 | 50.0 |
| 14 | −156.081022 | 1.422005 | | | 63.9 |
| 15 | −486.539890 | 47.655460 | SiO2 | 1.560326 | 71.6 |
| 16 | −145.998658 | 31.972353 | | | 84.8 |
| 17 | −348.248310 | 43.797225 | SiO2 | 1.560326 | 102.0 |
| 18 | −140.291349 | 0.999740 | | | 106.7 |
| 19 | 232.808525 | 41.652492 | SiO2 | 1.560326 | 110.3 |
| 20 | −1542.698503 | 18.417426 | | | 108.8 |
| 21 | 248.424217 | 32.676558 | SiO2 | 1.560326 | 96.9 |
| 22 | −566.532409 | 60.999503 | | | 93.6 |
| 23 | 0.000000 | −190.641563 | Mirror | | 61.4 |
| 24 | 86.482697 | −14.999997 | SiO2 | 1.560326 | 66.2 |
| 25 | 500.427293 | −37.644688 | | | 78.0 |
| 26 | 100.486878 | −15.000000 | SiO2 | 1.560326 | 79.9 |
| 27 | 197.988955 | −60.877659 | | | 99.1 |
| 28 | 179.367267 | 60.877659 | Mirror | | 126.0 |
| 29 | 197.988955 | 15.000000 | SiO2 | 1.560326 | 99.1 |
| 30 | 100.486878 | 37.644688 | | | 79.9 |
| 31 | 500.427293 | 14.999997 | SiO2 | 1.560326 | 78.0 |
| 32 | 86.482697 | 190.641563 | | | 66.2 |
| 33 | 0.000000 | −63.986675 | Mirror | | 60.5 |

TABLE 4-continued

NA 1.2
Object height 57.27 mm
Wavelength 193.306 nm

| | | | | |
|---|---|---|---|---|
| 34 | −285075.29129 | −27.831528 | SiO2 1.560326 | 85.6 |
| 35 | 228.534992 | −0.999627 | | 88.4 |
| 36 | −322.030431 | −31.846451 | SiO2 1.560326 | 95.9 |
| 37 | 642.619859 | −0.999779 | | 96.3 |
| 38 | −207.885606 | −31.716906 | SiO2 1.560326 | 95.7 |
| 39 | −2693.256255 | −0.999939 | | 93.8 |
| 40 | −171.837406 | −50.491827 | SiO2 1.560326 | 87.2 |
| 41 | −234.721487 | −18.197836 | | 71.8 |
| 42 | 10184.081271 | −9.999825 | SiO2 1.560326 | 70.1 |
| 43 | −92.193672 | −42.463310 | | 62.7 |
| 44 | 153.048676 | −11.806076 | SiO2 1.560326 | 63.3 |
| 45 | −176.363258 | −23.590830 | | 73.3 |
| 46 | −770.857365 | −30.764713 | SiO2 1.560326 | 84.5 |
| 47 | 250.870602 | −85.618367 | | 88.5 |
| 48 | 1296.256433 | −40.113912 | SiO2 1.560326 | 128.2 |
| 49 | 255.085284 | −0.999489 | | 131.1 |
| 50 | −460.040637 | −25.066872 | SiO2 1.560326 | 139.3 |
| 51 | −1351.396682 | −45.542090 | | 139.0 |
| 52 | 0.000000 | 44.543233 | | 139.5 |
| 53 | −244.654468 | −40.273655 | SiO2 1.560326 | 139.5 |
| 54 | −2965.864891 | −0.999880 | | 137.9 |
| 55 | −277.452613 | −46.119897 | SiO2 1.560326 | 137.3 |
| 56 | −42170.053939 | −1.000017 | | 135.1 |
| 57 | −221.850060 | −41.254860 | SiO2 1.560326 | 122.2 |
| 58 | −1257.777164 | −3.405755 | | 117.6 |
| 59 | −116.713650 | −42.569391 | SiO2 1.560326 | 89.3 |
| 60 | −146.089044 | −0.999670 | | 72.9 |
| 61 | −123.011741 | −29.669599 | SiO2 1.560326 | 68.5 |
| 62 | −101.962824 | −0.997392 | | 47.9 |
| 63 | −48.141542 | −39.433379 | SiO2 1.560326 | 39.1 |
| 64 | 0.000000 | −1.000000 | H2O 1.470000 | 15.7 |
| 65 | 0.000000 | 0.000000 | | 14.32 |

Aspherical constants

| Surface number | 8 | 17 | 22 | 24 |
|---|---|---|---|---|
| K | 0 | 0 | 0 | 0 |
| C1 | 1.085222E−07 | −3.585306E−08 | 6.531926E−08 | −1.164073E−07 |
| C2 | −7.098636E−12 | 3.029310E−12 | −3.471057E−13 | −9.598245E−12 |
| C3 | 7.595260E−16 | −1.272440E−16 | 2.382959E−20 | −5.673832E−16 |
| C4 | −3.997508E−20 | −2.465018E−21 | −3.074638E−22 | −1.793596E−19 |
| C5 | 1.134210E−24 | 2.767731E−25 | 6.582722E−26 | 2.056759E−23 |
| C6 | 7.519017E−31 | −5.892385E−30 | −2.104968E−30 | −5.789013E−27 |

| Surface number | 32 | 41 | 43 | 45 |
|---|---|---|---|---|
| K | 0 | 0 | 0 | 0 |
| C1 | −1.164073E−07 | −5.989275E−08 | 8.773527E−08 | −6.607455E−08 |
| C2 | −9.598245E−12 | 1.559695E−12 | −1.320072E−11 | 1.776221E−11 |
| C3 | −5.673832E−16 | −5.172657E−16 | 5.750593E−16 | 7.845170E−17 |
| C4 | −1.793596E−19 | −3.007196E−20 | 1.742753E−19 | −1.526660E−19 |
| C5 | 2.056759E−23 | 4.869722E−24 | −3.002730E−23 | 1.149921E−23 |
| C6 | −5.789013E−27 | −7.884376E−28 | 9.360249E−27 | −9.411838E−29 |

| Surface | 48 | 54 | 60 | 62 |
|---|---|---|---|---|
| K | 0 | 0 | 0 | 0 |
| C1 | −3.134012E−09 | −3.398024E−08 | 1.728471E−07 | −2.339359E−07 |
| C2 | 1.464979E−13 | 4.808498E−13 | −3.333111E−11 | 1.836163E−11 |
| C3 | 3.694193E−18 | −1.458951E−17 | 3.451475E−15 | −1.172949E−14 |
| C4 | −2.115799E−22 | 2.971262E−22 | −2.915216E−19 | 9.334924E−19 |
| C5 | −2.379158E−28 | −7.167529E−27 | 1.258174E−23 | −8.100903E−23 |
| C6 | −7.540437E−33 | 7.100560E−32 | 7.024843E−29 | −1.486466E−25 |

Decentring and tilt

| Surface number | Δx [mm] | Δy [mm] | Δz [mm] | alpha [°] | beta [°] |
|---|---|---|---|---|---|
| 23 | 0 | 0 | 0 | 45 | 0 |
| 33 | 0 | 0 | 0 | 45 | 0 |

The invention claimed is:

1. A catadioptric projection objective for microlithography and configured to image an object field in an object plane onto an image field in an image plane, comprising:
a first partial objective configured to image the object field onto a first real intermediate image,
a second partial objective configured to image the first intermediate image onto a second real intermediate image, and
a third partial objective configured to image the second intermediate image onto the image field,
wherein the second partial objective has exactly one concave mirror and at least one lens,
wherein the projection objective has a first folding mirror configured to deflect the radiation from the object plane toward the concave mirror and a second folding mirror configured to deflect the radiation from the concave mirror toward the image plane,
wherein the projection objective forms exactly two real intermediate images,
wherein the projection objective has a numerical aperture of greater than 1.0 in the image plane, and
wherein a minimum distance between an optically utilized region of a mirror surface of the concave mirror and an optically utilized region of a surface, which faces the concave mirror, of a lens adjacent to the concave mirror is greater than 20 mm.

2. The catadiopric projection objective according to claim 1,
wherein the first partial objective has a first optical axis,
wherein the second partial objective has a second optical axis,
wherein the third partial objective has a third optical axis,
wherein the at least one lens, is adjacent to the concave mirror,
wherein a distance between the concave mirror and the lens adjacent to the concave mirror is so large that all rays which emerge from an illumination pole in the entrance pupil and intersect the object plane at a central object point within the object field pass through that surface of the lens which faces the concave mirror on the light path towards the concave mirror and on the light path away from the concave mirror in spatially separated regions,
wherein the illumination pole represents a continuous region within the intensity distribution of the entrance pupil, in which the intensity does not fall below 10% of a maximum intensity,
wherein the illumination pole is arranged at an edge of the entrance pupil,
wherein the extent of the illumination pole in the y-direction is greater than 2% of the pupil radius of the entrance pupil,
wherein the y-direction runs parallel to a straight line that is perpendicular to the first optical axis and lies within a plane of symmetry, and
wherein the plane of symmetry is spanned by the first optical axis, the second optical axis and the third optical axis.

3. The projection objective according to claim 2, further comprising an entrance pupil having a pupil radius,
wherein the extent of the illumination pole in the y-direction is less than or equal to 8% of the pupil radius of the entrance pupil.

4. The projection objective according to claim 2,
wherein the concave mirror and the lens adjacent to the concave mirror each has a respective surface vertex, and
wherein the distance between the surface vertex of the concave mirror and the surface vertex of the lens adjacent to the concave mirror is less than a vertex radius of the concave mirror.

5. The projection objective according to claim 2,
wherein the concave mirror has a vertex radius of less than 200 mm.

6. The projection objective according to claim 2,
wherein the optically utilized region of the concave mirror has a diameter of less than 260 mm.

7. The projection objective according to claim 6,
wherein the lens adjacent to the concave mirror is composed of quartz.

8. The projection objective according to claim 1,
wherein the concave mirror and the lens adjacent to the concave mirror each has a respective surface vertex, and
wherein the distance between the surface vertex of the concave mirror and the surface vertex of the lens is less than a vertex radius of the concave mirror.

9. The projection objective according to claim 1,
wherein the concave mirror has a vertex radius of less than 200 mm.

10. The projection objective according to claim 1,
wherein the optically utilized region of the concave mirror has a diameter of less than 260 mm.

11. The projection objective according to claim 1,
wherein the lens adjacent to the concave mirror is composed of quartz.

12. A projection exposure apparatus for microlithography, comprising:
an illumination system configured to provide at least one illumination mode, and
a catadioptric projection objective for microlithography and configured to image an object field in an object plane onto an image field in an image plane, comprising:
an entrance pupil having a pupil radius,
a first partial objective having a first optical axis and configured to image the object field onto a first real intermediate image,
a second partial objective having a second optical axis and configured to image the first intermediate image onto a second real intermediate image, and
a third partial objective having a third optical axis and configured to image the second intermediate image onto the image field,
wherein the second partial objective has exactly one concave mirror and at least one lens,
wherein the projection objective has a first folding mirror configured to deflect the radiation from the object plane toward the concave mirror and a second folding mirror configured to deflect the radiation from the concave mirror toward the image plane,
wherein the projection objective forms exactly two real intermediate images,
wherein the projection objective has a numerical aperture of greater than 1.0 in the image plane,
wherein a minimum distance between an optically utilized region of the concave mirror and an optically utilized region of a surface, which faces the concave mirror, of a lens adjacent to the concave mirror is greater than 20 mm,
wherein the illumination system is further configured to illuminate the entrance pupil of the projection objective with at least one illumination pole in the illumination mode, wherein the illumination pole represents a continuous region within the intensity distribution of the entrance pupil, in which the intensity does not fall below 10% of a maximum intensity, wherein, for all illumination poles of the illumination mode, a maximum extent of the illumination pole in the y direction is less than or equal to 8% of the pupil radius of the entrance pupil, wherein the y direction runs parallel to a straight line that is perpendicular to the first optical axis and lies within a plane of symmetry, and wherein the plane of symmetry is spanned by the first optical axis, the second optical axis and the third optical axis.

13. The projection exposure apparatus according to claim 12, wherein the illumination system is configured to illuminate a center of the entrance pupil with the at least one illumination pole.

14. The projection exposure apparatus according to claim 12, wherein the illumination system is configured to arrange all the illumination poles at an edge of the entrance pupil.

15. The projection exposure apparatus according to claim 12, wherein the illumination system is configured to illuminate the entrance pupil with pairwise illumination poles lying opposite with respect to a center of the entrance pupil.

16. The projection exposure apparatus according to claim 12, wherein the illumination system is configured such that, for all the illumination modes, on the surface, facing the concave mirror, of the lens adjacent to the concave minor, a maximum surface power density is less than 0.6 W/cm$^2$ while a total power of illumination light in the object plane is greater than 1.5 W.

17. The projection exposure apparatus according to claim 12, wherein a distance between the concave minor and the lens adjacent to the concave minor is so large that all rays which emerge from an illumination pole in the entrance pupil and intersect the object plane at a central object point within the object field pass through that surface of the lens which faces the concave mirror on the light path towards the concave mirror and on the light path away from the concave mirror in spatially separated regions, wherein the illumination pole is arranged at an edge of the entrance pupil, and wherein, for all illumination poles of the illumination mode, a maximum extent of the illumination pole in the y direction is greater than 2% and less than or equal to 8% of the pupil radius of the entrance pupil.

18. The projection exposure apparatus according to claim 17, wherein the illumination system is configured to illuminate a center of the entrance pupil with the at least one illumination pole.

19. The projection exposure apparatus according to claim 17, wherein the illumination system is configured to arrange all the illumination poles at an edge of the entrance pupil.

20. The projection exposure apparatus according to claim 17, wherein the illumination system is configured to illuminate the entrance pupil with pairwise illumination poles lying opposite with respect to a center of the entrance pupil.

21. The projection exposure apparatus according to claim 17, wherein the illumination system is configured such that, for all the illumination modes, on the surface, facing the concave mirror, of the lens adjacent to the concave mirror, a maximum surface power density is less than 0.6 W/cm2 while a total power of illumination light in the object plane is greater than 1.5 W.

22. A method for operating a projection exposure apparatus for microlithography, comprising:

providing at least one illumination mode with an illumination system, and imaging an object field in an object plane onto an image field in an image plane with a catadioptric projection objective which comprises:

an entrance pupil having a pupil radius, a first partial objective having a first optical axis and imaging the object field onto a first real intermediate image, a second partial objective having a second optical axis and imaging the first intermediate image onto a second real intermediate image, wherein the second partial objective has exactly one concave mirror and at least one lens, a third partial objective having a third optical axis and imaging the second intermediate image onto the image field, and a first folding mirror deflecting the radiation from the object plane toward the concave mirror and a second folding mirror for deflecting the radiation from the concave mirror toward the image plane, wherein the projection objective forms exactly two real intermediate images, wherein the projection objective has a numerical aperture of greater than 1.0 in the image plane, wherein a minimum distance between an optically utilized region of the concave mirror and an optically utilized region of a surface, which faces the concave mirror, of a lens adjacent to the concave mirror is greater than 20 mm, wherein the illumination system, in accordance with the illumination mode, illuminates the entrance pupil of the projection objective with a differing number of illumination poles and with illumination poles of differing form, wherein each illumination pole represents a continuous region within the intensity distribution of the entrance pupil, in which the intensity does not fall below 10% of a maximum intensity, wherein a maximum extent of the illumination pole in the y direction is less than or equal to 8% of the pupil radius of the entrance pupil, wherein the y direction runs parallel to a straight line that is perpendicular to the first optical axis and lies within a plane of symmetry, and wherein the plane of symmetry is spanned by the first optical axis, the second optical axis and the third optical axis.

23. A method for operating a projection exposure apparatus for microlithography, comprising providing at least one illumination mode with an illumination system, imaging an object field in an object plane onto an image field in an image plane with a catadioptric projection objective which comprises:

an entrance pupil having a pupil radius, a first partial objective having a first optical axis and imaging the object field onto a first real intermediate image, a second partial objective having a second optical axis and imaging the first intermediate image onto a second real intermediate image and having exactly one concave mirror and at least one lens, which is adjacent to the concave mirror, a third partial objective having a third optical axis and imaging the second intermediate image onto the image field, a first folding mirror deflecting the radiation from the object plane toward the concave mirror and a second folding mirror deflecting the radiation from the concave mirror toward the image plane, wherein the projection objective forms exactly two real intermediate images, wherein the projection objective has a numerical aperture of greater than 1.0 in the image plane, wherein a minimum distance between an optically utilized region of the concave mirror and an optically utilized region of a surface, which faces the concave mirror, of a lens adjacent to the concave mirror is greater than 20 mm, wherein the illumination system, in accordance with the illumination mode, illuminates the entrance pupil of the projection objective with a differing number of illumination poles and with illumination poles of differing form, wherein each illumination pole represents a continuous region within the intensity distribution of the entrance pupil, in which the intensity does not fall below 10% of a maximum intensity, and providing an illumination mode only when, on the surface, facing the concave mirror, of the lens adjacent to the concave mirror, a maximum surface power density is less than 0.6 $W/cm^2$ while a total power of illumination light in the object plane is greater than 1.5 W.

* * * * *

UNITED STATES PATENT AND TRADEMARK OFFICE
CERTIFICATE OF CORRECTION

Page 1 of 2

PATENT NO. : 8,300,211 B2
APPLICATION NO. : 12/748862
DATED : October 30, 2012
INVENTOR(S) : Alexander Epple et al.

It is certified that error appears in the above-identified patent and that said Letters Patent is hereby corrected as shown below:

In the Specifications:

Column 11, Lines 34-40: below "k in" delete

TABLE 2

| Aperture ray | $x_f$ [mm] | $y_f$ [mm] | $x_p$ | $y_p$ |
|---|---|---|---|---|
| 39 | 0 | -20.89 | 0 | +0.048 |
| 41 | 0 | -20.89 | 0 | -0.048 |

" and insert -- $\left[\dfrac{1}{mm^{2k+2}}\right]^*$ --

Column 13, Lines 4-6: Below "Table 2."

delete " $\left[\dfrac{1}{mm^{2k+2}}\right]^*$ " and

TABLE 2

| Aperture ray | $x_f$ [mm] | $y_f$ [mm] | $x_p$ | $y_p$ |
|---|---|---|---|---|
| 39 | 0 | -20.89 | 0 | +0.048 |
| 41 | 0 | -20.89 | 0 | -0.048 | insert -- --

Signed and Sealed this
Thirtieth Day of April, 2013

Teresa Stanek Rea
*Acting Director of the United States Patent and Trademark Office*

CERTIFICATE OF CORRECTION (continued)
U.S. Pat. No. 8,300,211 B2

In the Claims:

Column 27, Line 29: In Claim 2, delete "catadiopric" and insert -- catadioptric --

Column 27, Line 35: In Claim 2, delete "lens," and insert -- lens --

Column 28, Line 12: In Claim 7, delete "claim 6," and insert -- claim 2, --

Column 29, Line 37: In Claim 16, delete "minor," and insert -- mirror, --

Column 29, Line 43: In Claim 17, delete "minor" and insert -- mirror --

Column 29, Line 44: In Claim 17, delete "minor" and insert -- mirror --

Column 30, Line 13: In Claim 21, delete "W/cm2" and insert -- $W/cm^2$ --